(12) United States Patent
Ku et al.

(10) Patent No.: US 7,782,070 B2
(45) Date of Patent: Aug. 24, 2010

(54) PROBING DEVICE

(75) Inventors: Wei-Cheng Ku, Hsinchu Hsiang (TW);
Chih-Hao Ho, Hsinchu Hsiang (TW);
Ho-Hui Lin, Hsinchu Hsiang (TW);
Te-Chen Feng, Hsinchu Hsiang (TW);
Jun-Liang Lai, Hsinchu Hsiang (TW);
Jia-Chi Ho, Hsinchu Hsiang (TW);
Chih-Chung Chien, Hsinchu Hsiang (TW);
Chien-Huei Huang, Hsinchu Hsiang (TW);
Ai-Chuan Chang, Hsinchu Hsiang (TW);
Horng-Chuan Sun, Hsinchu Hsiang (TW)

(73) Assignee: MJC Probe Incorporated, Hsinchu Hsiang (TW)

( * ) Notice: Subject to any disclaimer, the term of this patent is extended or adjusted under 35 U.S.C. 154(b) by 259 days.

(21) Appl. No.: 12/133,249

(22) Filed: Jun. 4, 2008

(65) Prior Publication Data
US 2009/0009198 A1 Jan. 8, 2009

(30) Foreign Application Priority Data

Jun. 5, 2007 (TW) .............................. 96120184 A
Sep. 19, 2007 (TW) .............................. 96134978 A
Mar. 13, 2008 (TW) .............................. 97108934 A

(51) Int. Cl.
*G01R 31/02* (2006.01)
(52) U.S. Cl. .................... 324/754; 324/761; 324/762
(58) Field of Classification Search .............. 324/158.1, 324/750–758, 760–765; 438/14–18; 257/686, 257/700
See application file for complete search history.

(56) References Cited

U.S. PATENT DOCUMENTS

| 5,808,475 | A | 9/1998 | Knauer et al. |
| 6,747,447 | B2 * | 6/2004 | Markert et al. ............ 324/158.1 |
| 7,622,936 | B2 * | 11/2009 | Weiland et al. .............. 324/754 |

* cited by examiner

*Primary Examiner*—Minh N Tang
*Assistant Examiner*—Trung Q Nguyen
(74) *Attorney, Agent, or Firm*—Browdy and Neimark, PLLC

(57) ABSTRACT

A probing device includes a rack that has an outer support member supporting a circuit layer and a center support member supporting a probe assembly. When the tester touching down the circuit layer of the probing device from the top side, the outer support member of the rack bears this touchdown stress. When the probes of the probe holder touching down the electronic components of an IC wafer under test, the center support member of the rack bears the reaction force from the IC wafer.

31 Claims, 22 Drawing Sheets

PROBING DEVICE

BACKGROUND OF THE INVENTION

1. Field of the Invention

The present invention relates to test device and more particularly, to a probing device for testing IC wafers.

2. Description of the Related Art

When testing an IC wafer, a probe card is used for transmitting test signals from a tester to the IC wafer. A typical conventional probe card comprises a circuit board for touchdown by the test head of a tester and receiving test signals from the tester, and a plurality of probes arranged in a high density manner at the center area of the bottom side of the circuit board for transmitting test signals from the circuit board to the IC wafer under test. After the probes touched down the electronic components of the IC wafer under test, test signals are transmitted from the tester to the electronic components of the IC wafer through the probe card, and measured signals are transmitted backwards from the electronic components of the IC wafer through the probe card to the tester for analysis. During the whole wafer level testing process, the circuit transmission design of the circuit board of the probe card greatly affects the test result. Following the development of electronic technology for high speed operation, the testing process must be run under a high speed environment. Therefore, the transmission circuit design must fit the requirements for high speed operation.

FIG. 1 illustrates a probe card design according to U.S. Pat. No. 5,808,475, entitled "Semiconductor probe card for low current measurements". According to this design, the probe card 1 is formed from a contact board 10 disposed at the top side, a probe board 12 disposed at the bottom side, and spacers 14 set between the contact board 10 and the probe board 12. The contact board 10 is provided with coaxial cable-like test contacts 11 to avoid leakage current problem due to formation of parasitic resistance in the dielectric structure. However, because the contact board 10 is touched down by the test head of the tester 1' directly and the probe board 12 is for the mounting of probes 13, the stress produced at the probe card 1 when the test head of the tester 1' touching down the contact board 10 and the probes 13 touching down the IC wafer under test may cause the contact board 10 or the probe board 12 to deform due to uneven distribution of pressure if the contact board 10 or the probe board 12 itself isn't provided with an sufficient structural strength and/or an certain thickness. Further, when the probes 13 touching down the IC wafer, the front side of the probe board 12 keeps bearing the reaction force from the IC wafer. Under the effect of this reaction force, the structure of the front plane of the probe board 12 that holds the probes 13 may deform easily.

FIG. 2 illustrates another prior art design of probe card 2. According to this design, the probe card 2 comprises a multi-layer printed circuit board 20 and a plurality of probes 22. The multi-layer printed circuit board 20 has multiple circuit lines 21 extending from the outer side toward the inner side and from the top toward the bottom and then respectively electrically connected to the probes 22 that suspending below the multi-layer printed circuit board 20. The structural strength and single thrust surface design of the multi-layer printed circuit board 20 can averagely disperse the force received from the test sample when bearing the stress from the test head of the tester, preventing deformation. However, because the multi-layer printed circuit board 20 is a lamination of multiple layers of glass fiber or ceramic material and because each layer has metal wires arranged thereon to form the circuit lines 21, the fabrication of this design of probe card is complicated, requiring much cost and labor time. Further, when arranging the circuit lines 21 in the multi-layer printed circuit board 20, the material of the multi-layer printed circuit board 20 in between each two adjacent circuit lines 21 may cause a leakage current. Further, the via holes 210 of the multi-layer printed circuit board 20 through which the circuit lines 21 extend tend to cause interface reflection during transmission of test signals, resulting in energy loss. These drawbacks greatly affect high frequency transmission characteristics. Therefore, this design of probe card does not meet the requirements for high speed test of integrated electronic components.

SUMMARY OF THE INVENTION

The present invention has been accomplished under the circumstances in view. It is the main object of the present invention to provide a probing device, which has a high structural strength, maintaining a high quality transmission characteristic.

It is another object of the present invention to provide a probing device, which has high efficiency and low cost characteristics.

It is still another object of the present invention to provide a probing device, which effectively isolates the internal signal lines from external moisture.

To achieve these and other objects of the present invention, a probing device is provided for transmitting test signals from a tester to an IC wafer for testing electric characteristics of the IC wafer. The probing device comprises a rack that has an outer support member extending around the periphery and supporting a circuit layer and a center support member disposed at the center and supporting a probe assembly. When the tester touching down the circuit layer of the probing device from the top side, the outer support member of the rack bears this touchdown stress. When the probes of the probe holder touching down the electronic components of an IC wafer under test, the center support member of the rack bears the reaction force from the IC wafer. Therefore, the high structural strength of the rack is practical for supporting any equivalent circuit layer and probe assembly structure capable of transmitting the test signals from the tester to the IC wafer to be tested. Further, because the circuit layer has an electrically insulated material structure of which the layer thickness is thinner than a typical conventional multi-layer printed circuit board, the traveling path of each test signal that goes through the circuit layer is short, effectively eliminating the problem of leakage current effect between each two adjacent transmission signals as seen in the prior art designs and also eliminating the drawback of complicated manufacturing process of the multi-layer printed circuit board type prior art design.

DETAILED DESCRIPTION OF THE INVENTION

Figure 1:
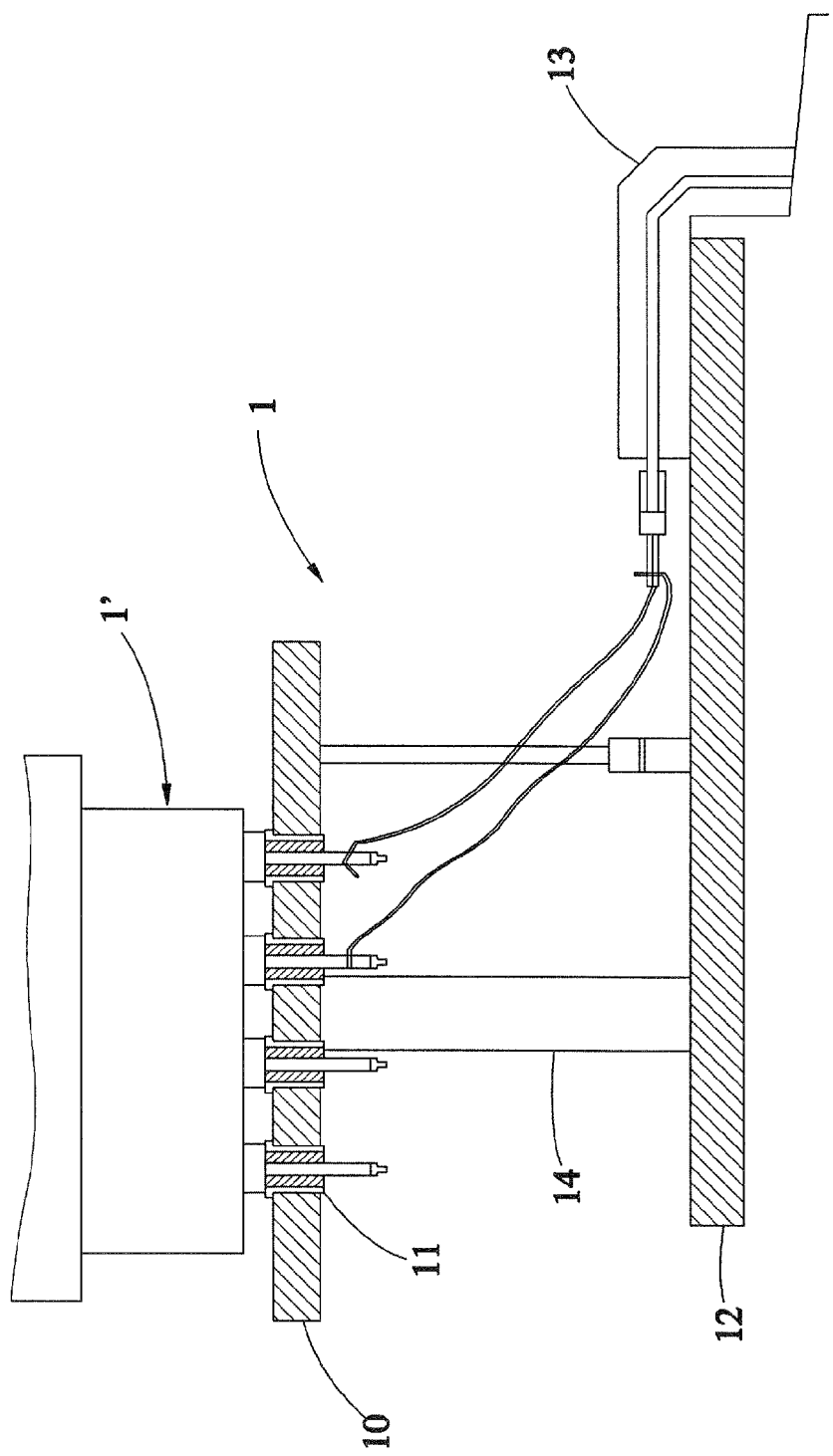
FIG. 1 is a schematic structural view of a probe card made according to U.S. Pat. No. 5,808,475.
Figure 2:
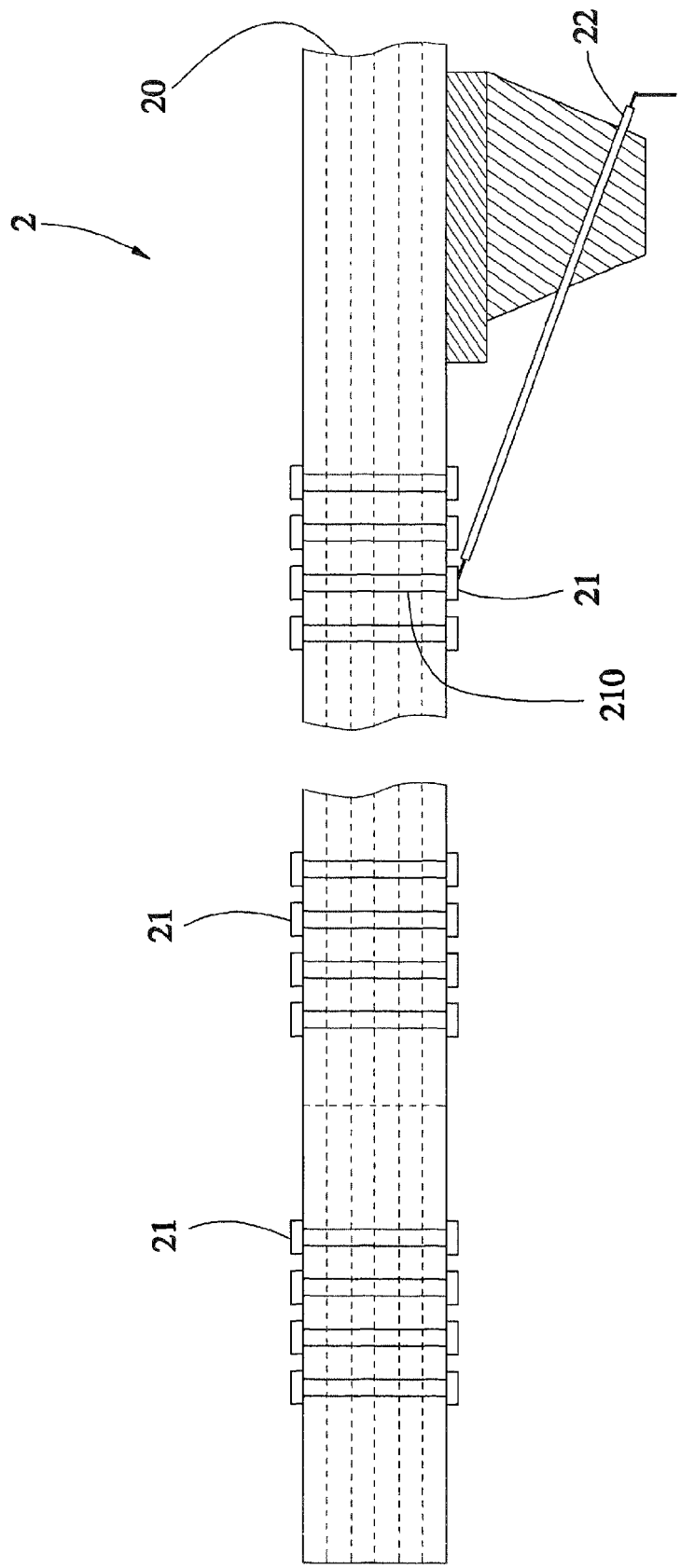
FIG. 2 is a schematic structural view of another design of probe card according to the prior art.
Figure 3:
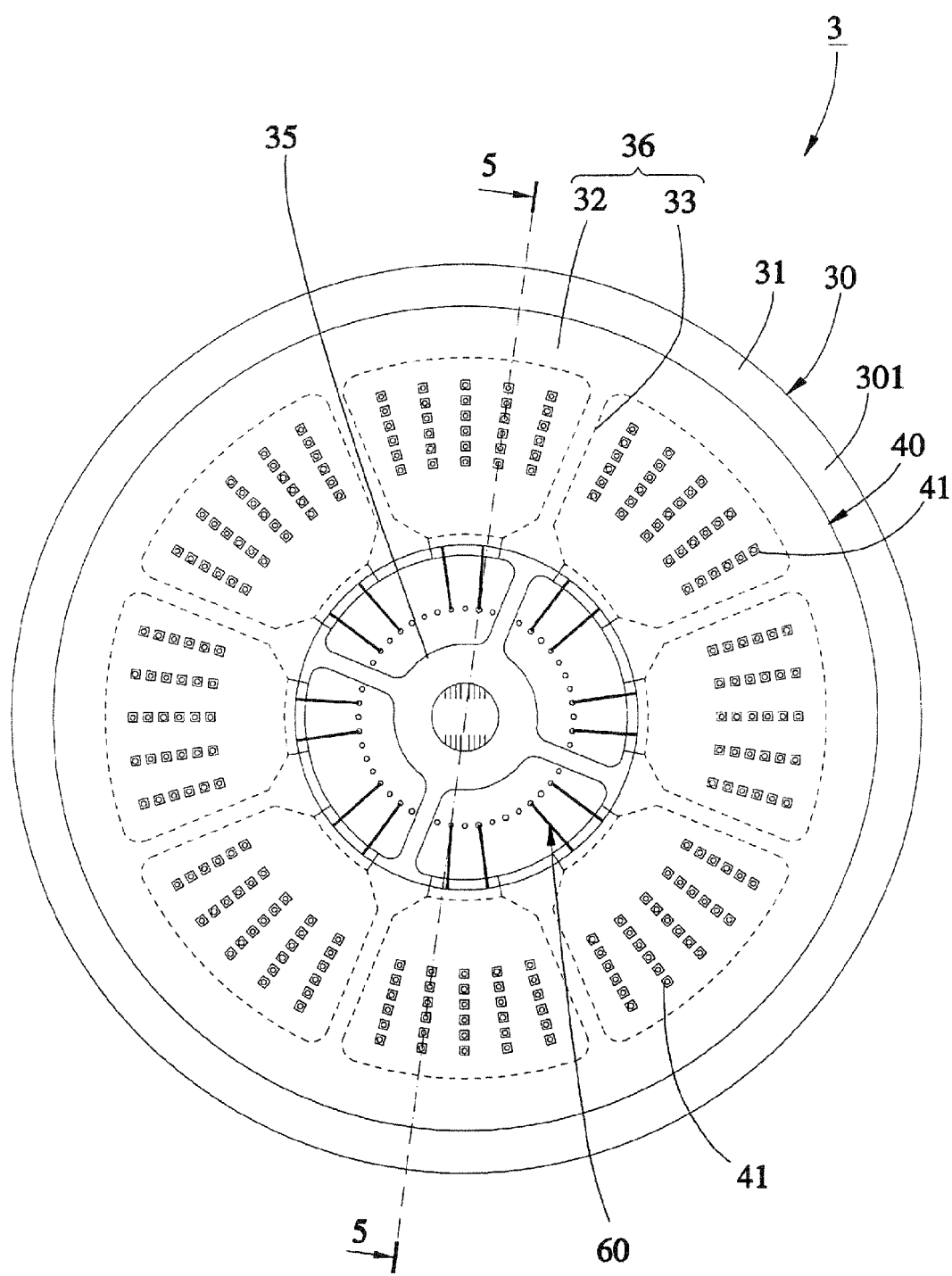
FIG. 3 is a top view of a probing device in accordance with a first embodiment of the present invention.
Figure 4:
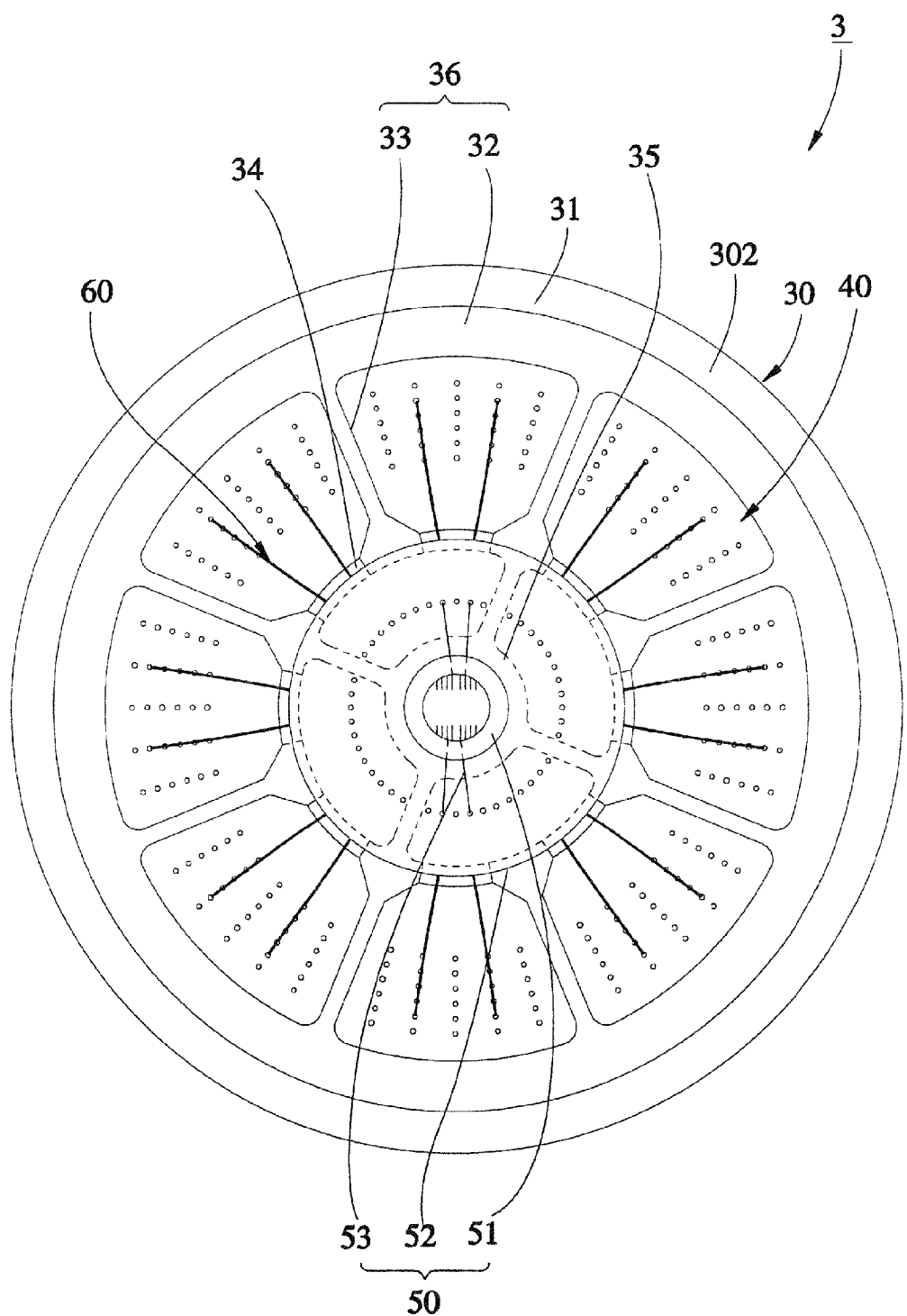
FIG. 4 is a bottom view of the probing device in accordance with the first embodiment of the present invention.
Figure 5:
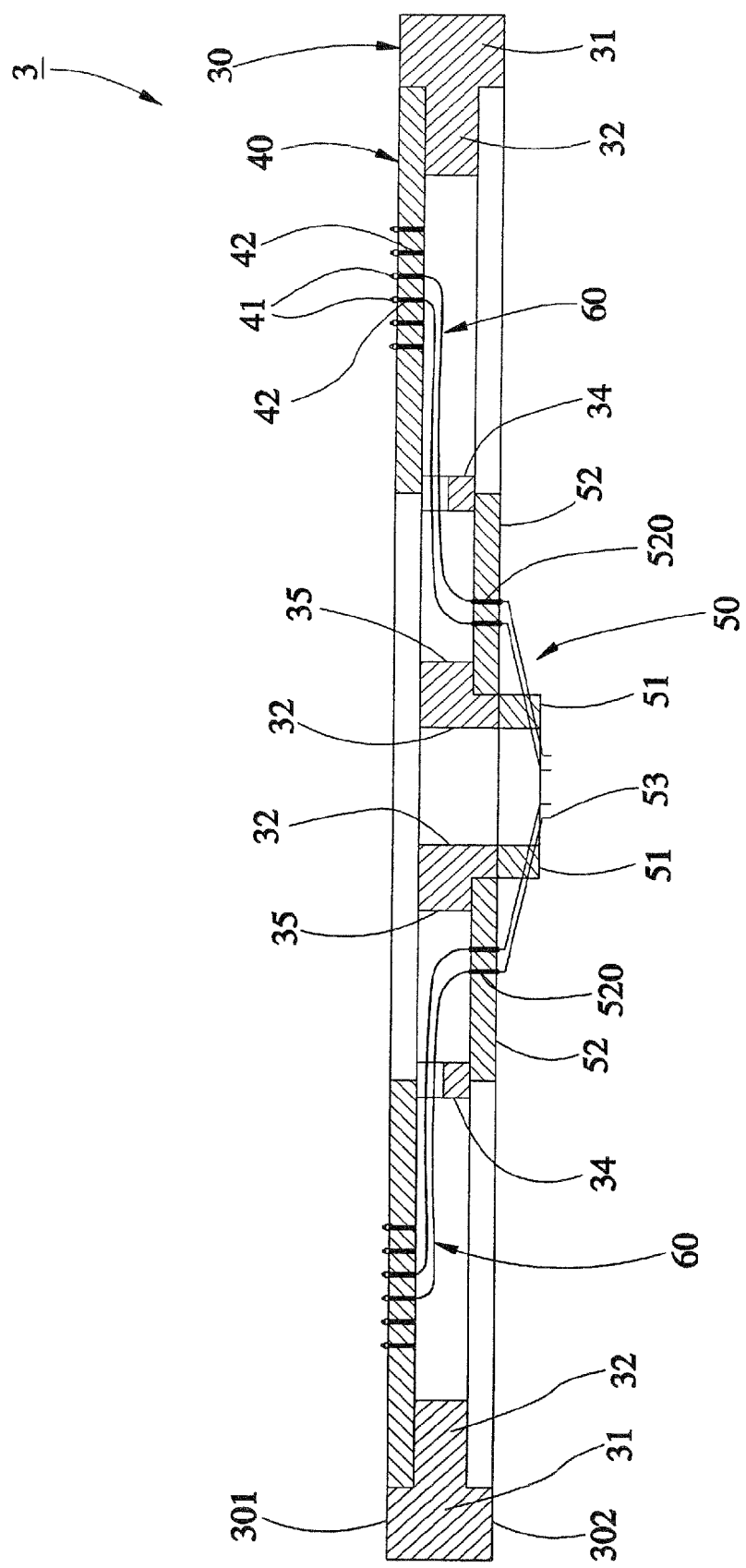
FIG. 5 is a sectional view taken along line A-A of FIG. 3.

Referring to FIGS. 3~5, a probing device 3 in accordance with a first embodiment of the present invention is shown for transmitting test signals from a tester to an IC wafer for measuring electric characteristics of the IC wafer. The probing device 3 comprises a rack 30, a circuit layer 40, a cantilever probe assembly 50, and multiple signal lines 60.

Figure 6:
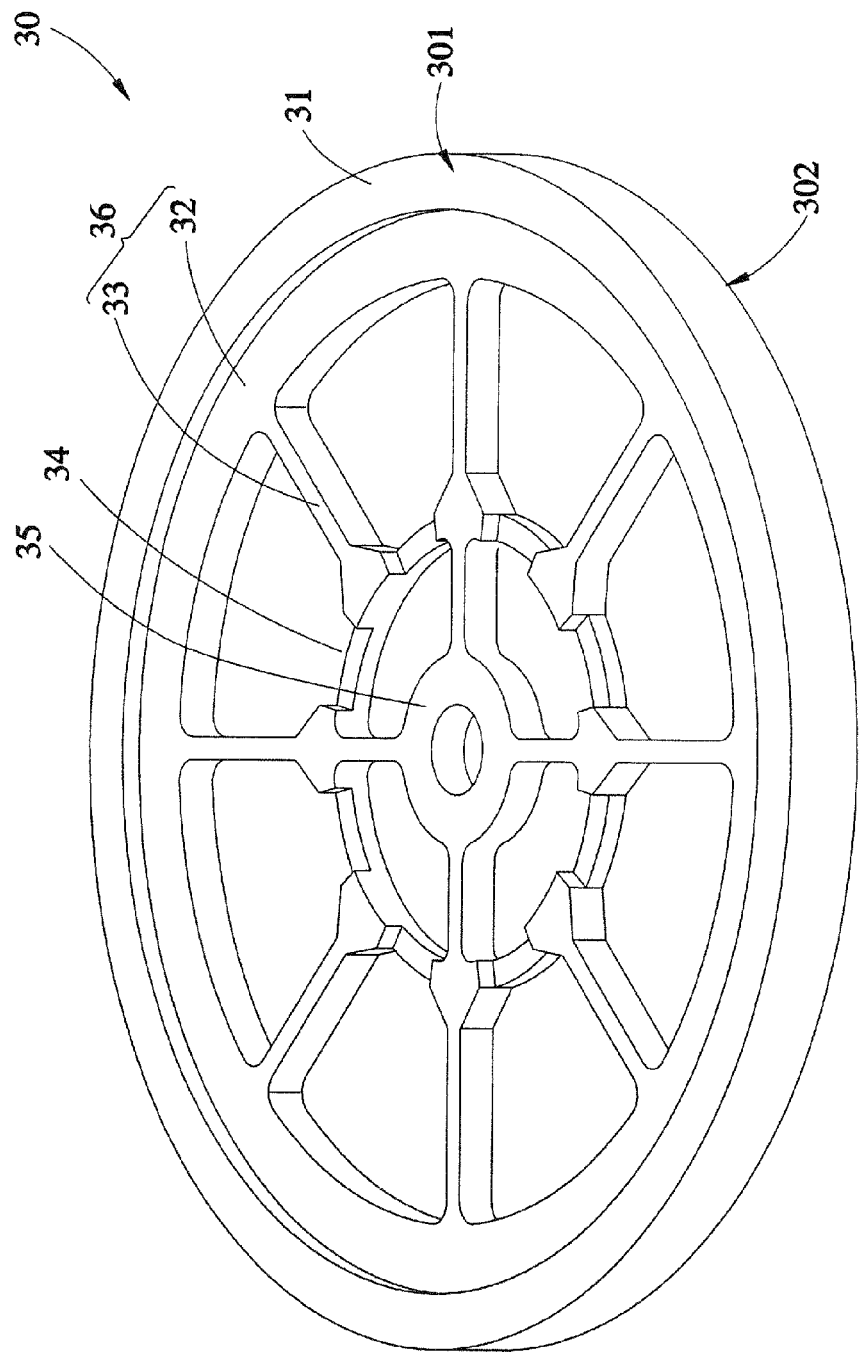
FIG. 6 is an oblique elevation of rack of the probing device in accordance with the first embodiment of the present invention.

Referring to FIG. 6 and FIG. 5 again, the rack 30 is a rigid annular member having a certain strength and a dimension approximately equal to a semiconductor IC wafer. The rack 30 can be integrally formed of metal (for example, stainless steel), having a thickness corresponding to a regular typical multi-layer printed circuit board to bear stress during test operation, without causing deformation of the planarity of the rigid body. The rack 30 has a top surface 301, and a bottom surface 302 opposite to the top surface 301. The rack 30 further has, arranged in proper order from the periphery toward the center, a first ring portion 31, a second ring portion 32, a plurality of radial rib portions 33, a third ring portion 34 and a fourth ring portion 35. The second ring portion 32 and the radial rib portions 33 form a first support part 36 of the rack 30. The sectional area of the first support part 36 corresponds to the transverse section of the circuit layer 40. Further, the first support part 36 is fully kept in contact with the horizontal surface of the circuit layer 40 to support the circuit layer 40 and any stress received by the circuit layer 40. The forth ring portion 35 forms a second support part of the rack 30 for supporting the probe assembly 50 and any stress received the probe assembly 50.

Referring to FIGS. 3 and 5 again, the circuit layer 40 is a single layer printed circuit board made of electrical insulated material, and mounted on the top surface 301 of the rack 30 corresponding to the first support part 36. The circuit layer 40 has multiple test contacts 41 for the connection of the aforesaid tester for receiving test signals from the tester, a plurality of via holes 42 respectively disposed corresponding to the test contacts 41. The via holes 42 each have a respective bottom end respectively connected with the signal lines 60 for transmitting the test signals from the respective test contacts 41 to the respective signal lines 60.

Referring to FIGS. 4 and 5 again, the probe assembly 50 comprises a probe holder 51, an adapter board 52, and multiple cantilever probes 53. The probe holder 51 is provided at the bottom side of the fourth ring portion 35 of the rack 30. Further, the probe holder 51 is made of electrical insulated and shockproof characteristics for the mounting of the cantilever probes 53. The cantilever probes 53 are installed in the probe holder 51, having the respective tip suspending below the probe holder 51. The adapter board 52 is a single layer printed circuit board made of an electrically insulated material, and fastened to the bottom side of the third and fourth ring portions 34 and 35 of the rack 30, having a plurality of electrically conducted via holes 520. The via holes 520 have the respective top and bottom ends respectively electrically connected with the signal lines 60 and the probes 53 by means of, for example, soldering.

As stated above, the invention utilizes the rigid structure of the rack 30 to support the circuit layer 40 at the top side and the probe holder 51 at the bottom side. When the tester touches down the test contacts 41 of the circuit layer 40, the first support part 46 of the rack 30 bears the stress; when the probes 53 touch respective electronic components of the IC wafer under test, the second support part of the rack 30 bears the reaction force from the wafer. Therefore, the invention simplifies the fabrication of a multi-layer printed circuit board. Further, the rack 30 is suitable for mass production and practical for use in any equivalent structure of circuit layer and probe assembly, shortening test device fabrication time.

Figure 7:
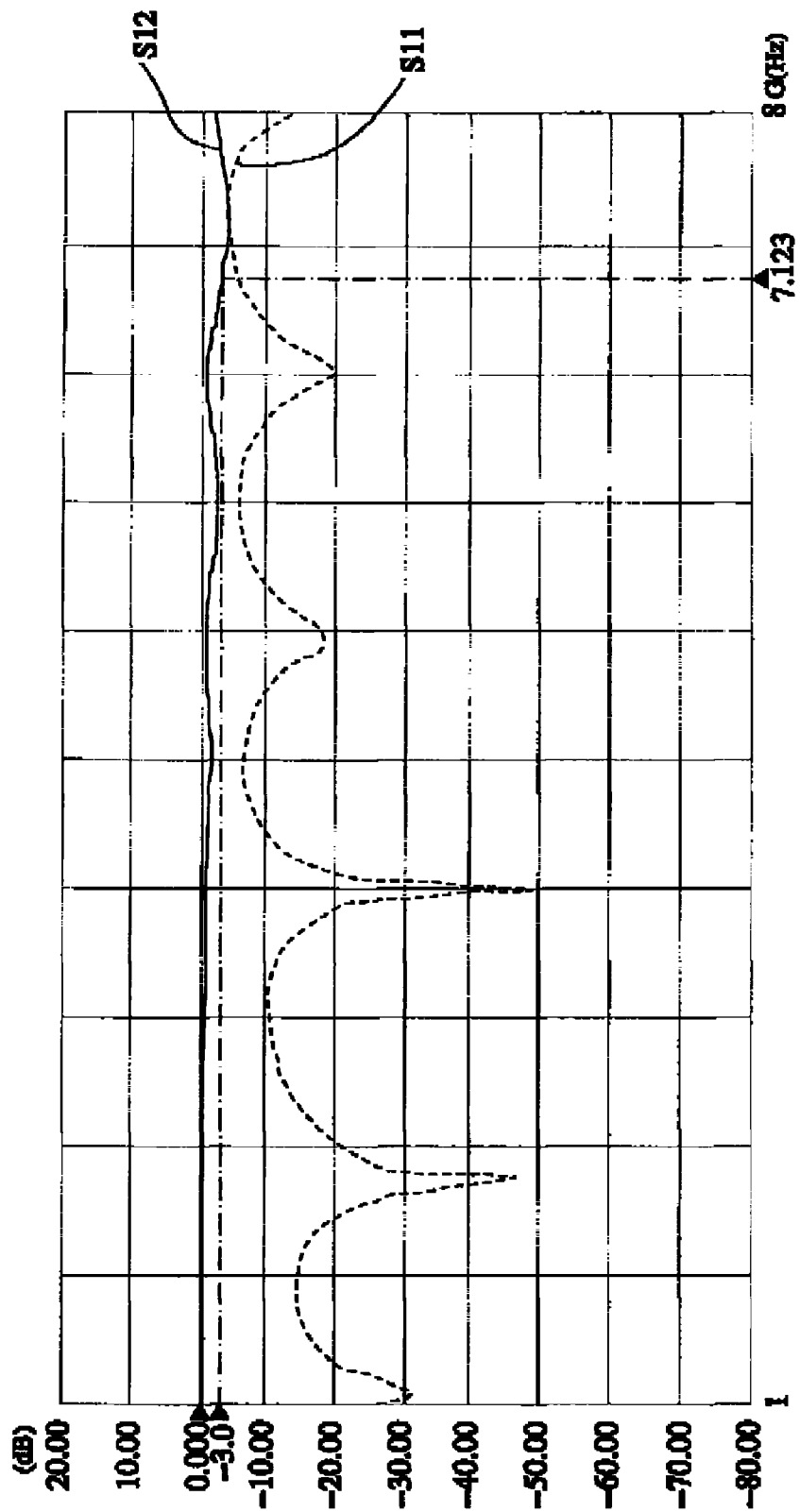
FIG. 7 is a high frequency signal characteristic curve diagram obtained from the probing device of the first embodiment of the present invention.

Further, because the circuit layer 40 and the adapter board 52 commonly have a single layer structure made of an electrically insulated material, the via holes 42 of the circuit layer 40 and the via holes 520 of the adapter board 52 have a very short path, effectively eliminating the effect of leakage current between two adjacent transmission signals during transfer of the test signals through the dielectric material. Further, the vertical paths of the via holes 40 and 520 do not go through any interlayer dielectric, and therefore no any energy loss problem will be encountered during transfer of test signals through the via holes 40 and 520, i.e., the probing device 3 maintains excellent signal impedance matching characteristic during a high frequency test. FIG. 7 is a signal frequency characteristic curve diagram obtained from the probing device 3. In this diagram, the reflection loss curve S11 shows that the probing device 3 has excellent impedance matching during transfer of high frequency signals; the insertion loss curve S12 shows that the −3 dB gain pass-band threshold frequency during high frequency application can be as high as several GHz frequency band, having high frequency signal transmission quality of low loss and excellent matching.

It is to be understood that the structures of the circuit layer 40 and the adapter board 52 are not limited to a single layer. If the energy loss is maintained within the acceptable range, the circuit layer 40 and the adapter board 52 can have a two-layer structure, enhancing the structural strength.

Figure 8:
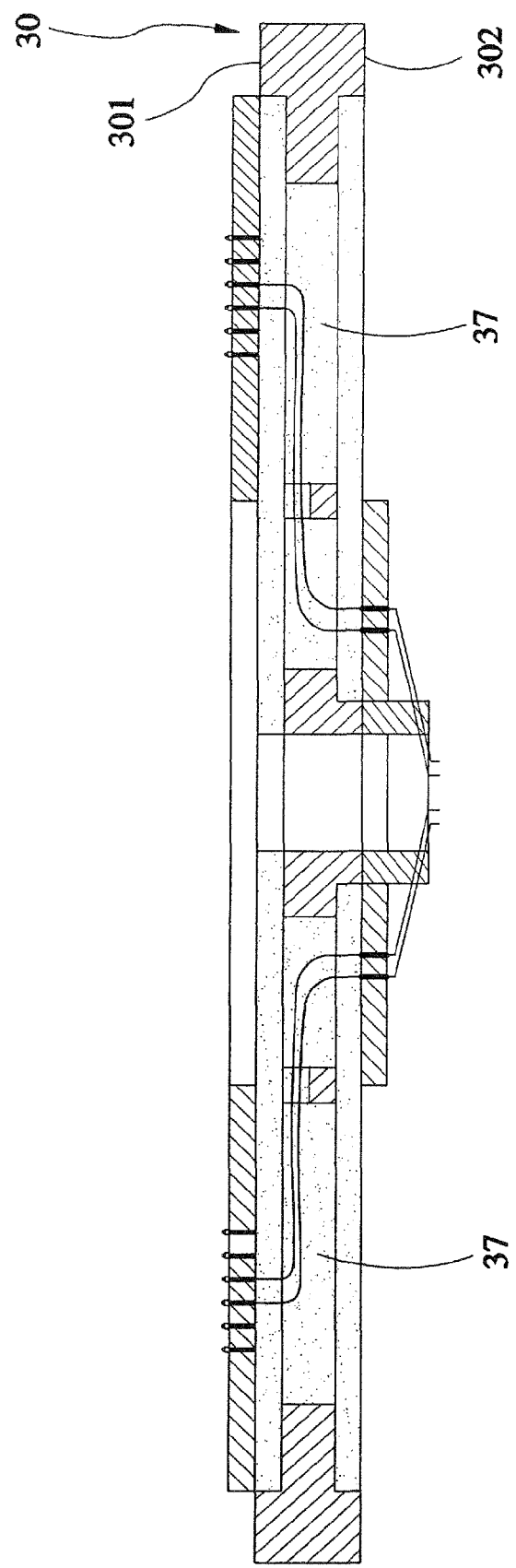
FIG. 8 corresponds to FIG. 5, showing an adhesive filled in the rack.

Further, as shown in FIG. 8, an adhesive (for example, epoxy resin) 37 may be filled in the rack 30 between the top surface 301 and the bottom surface 302 to enhance the structural strength of the probing device 3 and to encapsulate the signal lines 60, isolating the signal lines 60 from external moisture. Further, the adhesive 37 reinforces the strength of the rack 30. The rack 30 can be made of a nonmetal material, such as reinforced plastic, machinable ceramics.

Figure 9:
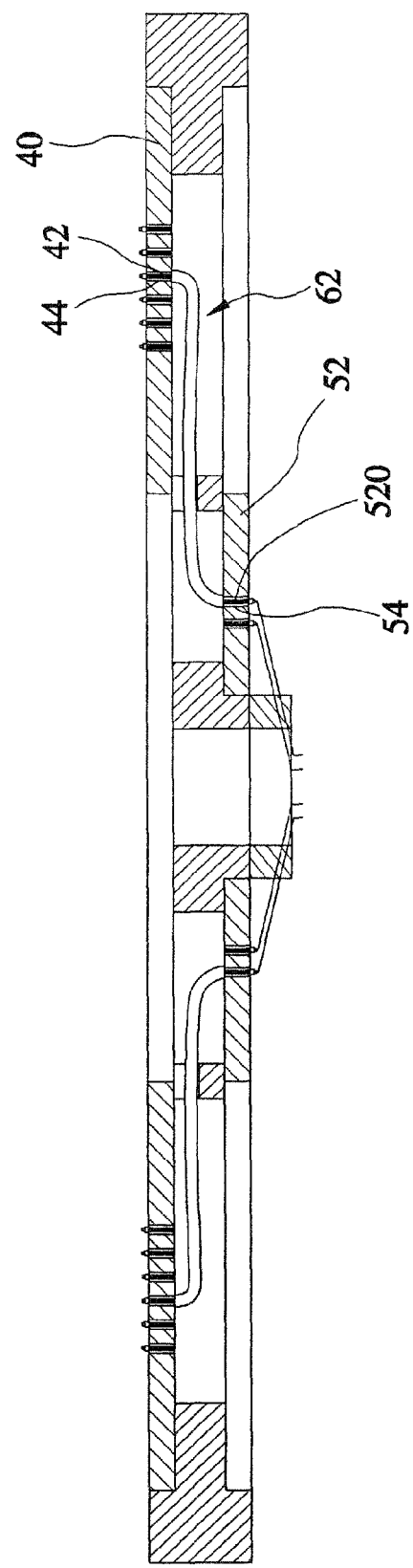
FIG. 9 is a schematic drawing showing an alternate form of the first embodiment of the present invention.

Referring to FIG. 9, grounding via holes 44 and 54 are respectively formed in the circuit layer 40 and the adapter board 52 corresponding to the via holes 42 and 520, and the via holes 42 of the circuit layer 40 are respectively electrically connected to the via holes 520 of the adapter board 52 through a respective coaxial transmission line 62. The two opposite ends of the central metal conductor of each of the coaxial transmission lines 62 are respectively plugged into the via holes 42 of the circuit layer 40 and the via holes 520 of the adapter board 52, and the two opposite ends of the grounding metal of each of the coaxial transmission lines 62 are respectively bonded to the grounding via holes 44 of the circuit layer 40 and the grounding via holes 54 of the adapter board 52.

Figure 10:
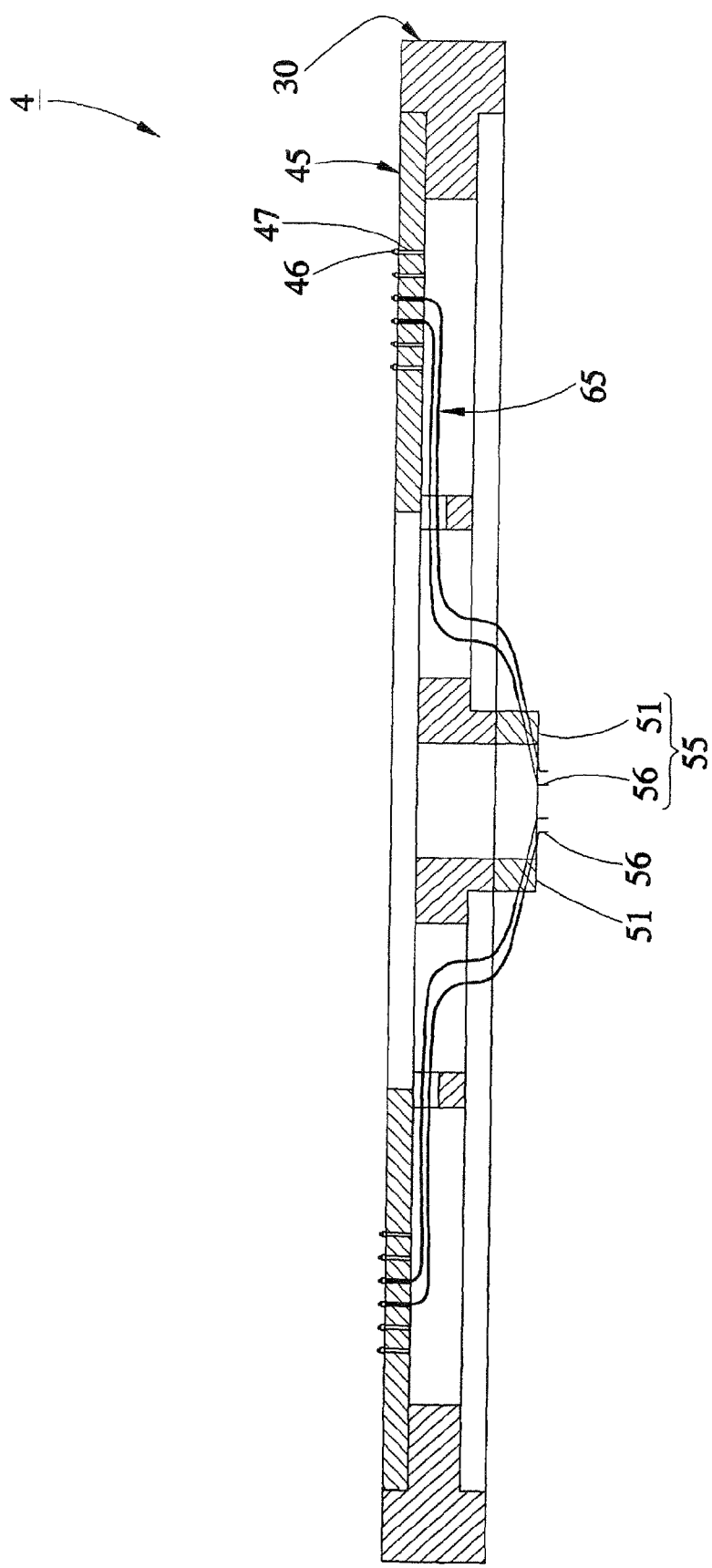
FIG. 10 is a schematic structural view of a probing device in accordance with a second embodiment of the present invention.

For a better performance in high frequency application, a probing device 4 in accordance with a second embodiment of the present invention as shown in FIG. 10 is a good choice. Similar to the aforesaid first embodiment, the probing device 4 according to this second embodiment is comprised of a rack 30, a circuit layer 45, a cantilever probe assembly 55, and a plurality of signal lines 65. When compared with the aforesaid first embodiment, this second embodiment has the following features:

The circuit layer 45 comprises a plurality of test contacts 46, and a plurality of through holes 47 corresponding to the test contacts 46. The signal lines 65 are respectively inserted through the through holes 47, and respectively electrically connected to the test contacts 46. The cantilever probe assembly 55 comprises a probe holder 51 and a plurality of cantilever probes 56. The cantilever probes 56 are respectively electrically connected with the signal lines 65 at locations near the probe holder 51.

When the test contacts 46 received high frequency test signals from the tester, the high frequency test signals are directly transferred through the signal lines 65 to the respective probes 56 without through any dielectric material, preventing the effect of leakage current between each two adjacent transmission signals. Under this single and high quality signal transmission environment, the probing device 4 has high frequency signal transmission quality of low loss and excellent matching.

Figure 11:
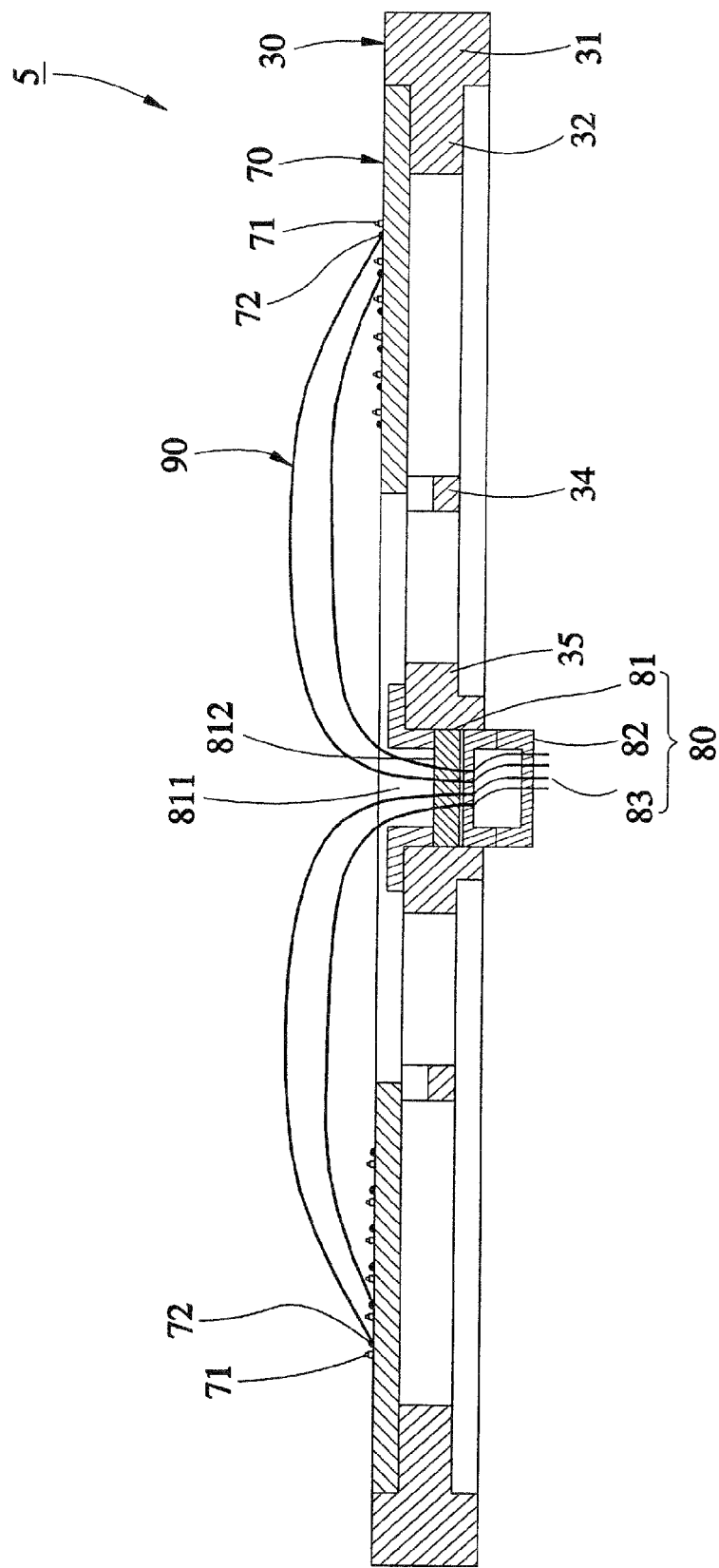
FIG. 11 is a schematic structural view of a probing device in accordance with a third embodiment of the present invention.

Except the application of the cantilever probe structures of the aforesaid two embodiments, the invention can be made in the form shown in FIG. 11. According to this third embodiment, the probing device 5 is an application of a vertical probe structure. According to this third embodiment, the probing device 5 is comprised of a rack 30, a circuit layer 70, a vertical probe assembly 80, and a plurality of signal lines 90. When compared with the aforesaid first embodiment, this third embodiment has the following features:

The circuit layer 70 comprises a plurality of test contacts 71, and a plurality of signal solder points 72 respectively disposed adjacent and electrically connected to the test contacts 71. The signal solder points 72 are respectively electrically connected with the signal lines 90 for transmitting test signals from the test contacts 71 to the respective signal lines 90.

The probe assembly 80 comprises a locating block 81, a probe holder 82, and a plurality of vertical probes 83. The locating block 81 is affixed to the fourth ring portion 35 of the rack 30, having a top opening 811 and a bottom 812. The signal lines 90 are extended through the top opening 811 into the inside of the locating block 81 and inserted through the bottom 812 of the locating block 81. The bottom side of the bottom 812 of the locating block 81 is fixedly fastened to the probe holder 82. The probe holder 82 is made of an electrically insulated material. The probes 83 are vertically inserted through the probe holder 82, each having one end, namely, the head respectively electrically connected to the signal lines 90 and the other end, namely, the tip suspending below the probe holder 82.

Same as the aforesaid first and second embodiments, the probing device 5 utilizes the rigid structure of the rack 30 to support the circuit layer 70 at the top side and the fourth ring portion 35 to support the locating block 81 and the probe holder 82 at the bottom side, allowing the rack 30 to bear all the stress received directly by the circuit layer 70 and the probes 83. Therefore, this embodiment effectively reduces the effect of leakage current between each two adjacent transmission signals, providing a high quality signal transmission environment.

Figure 12:
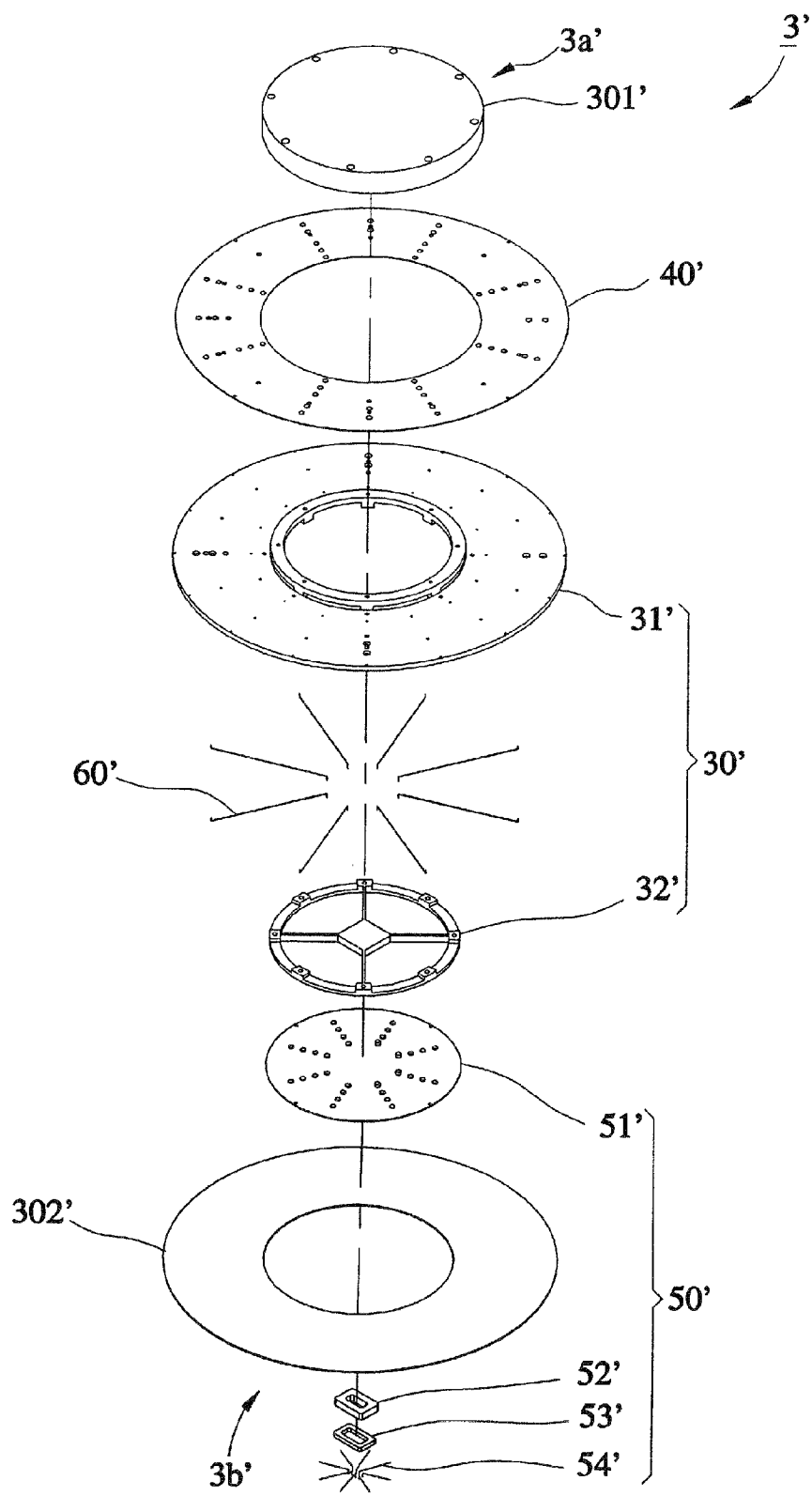
FIG. 12 is an exploded view of a probing device in accordance with a fourth embodiment of the present invention.
Figure 13:
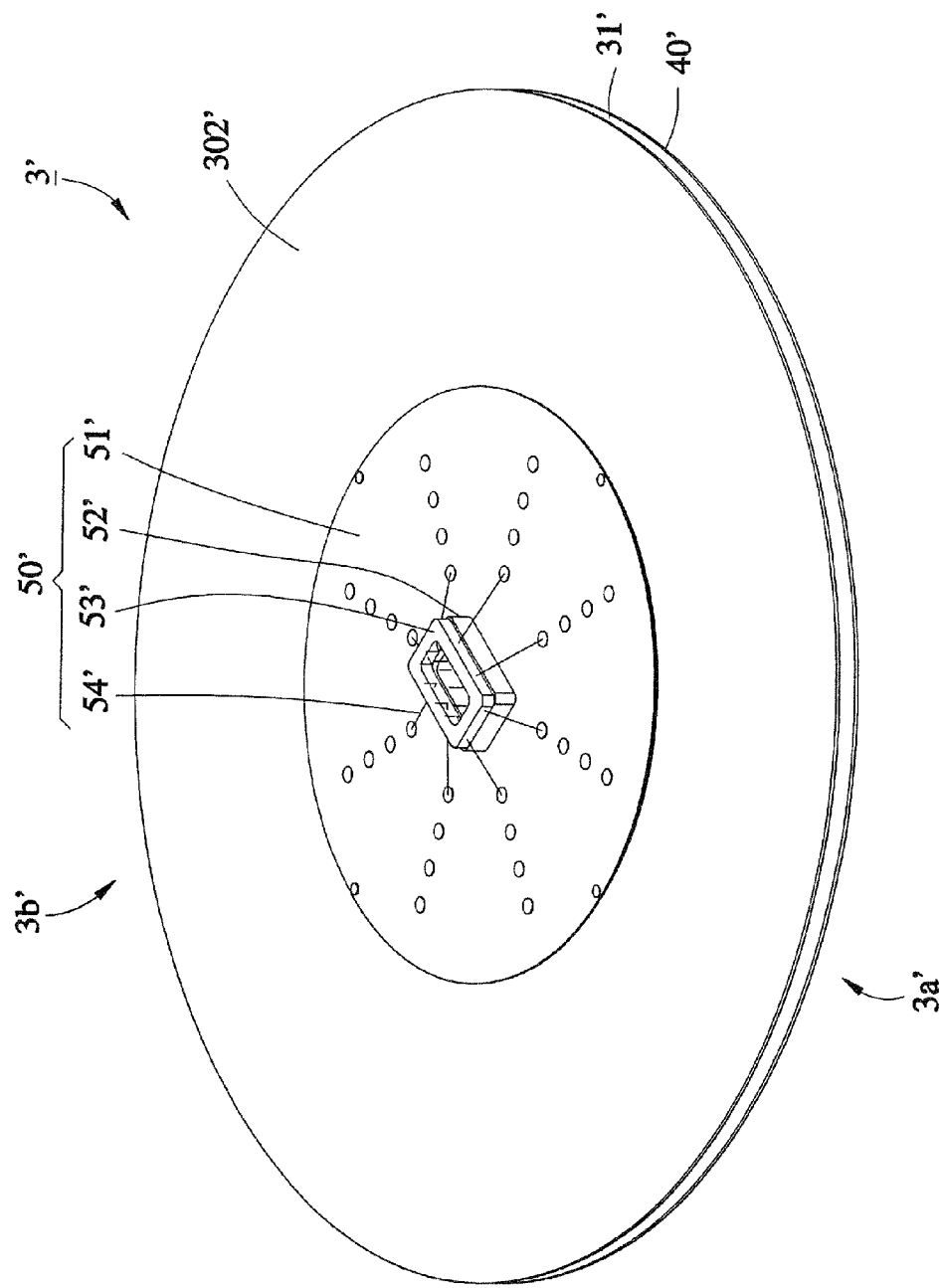
FIG. 13 is an oblique bottom elevation of the fourth embodiment of the present invention.
Figure 14:
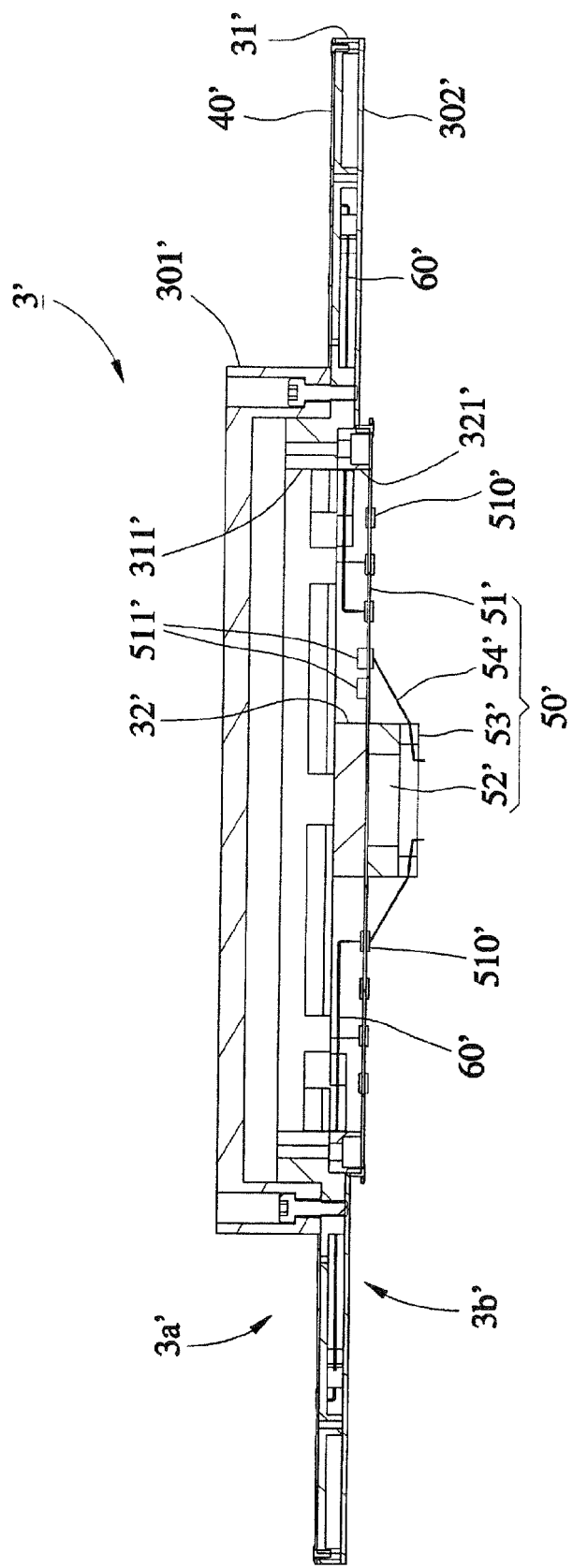
FIG. 14 is a schematic sectional structural view of the probing device in accordance with the fourth embodiment of the present invention.

FIGS. 12~14 show a probing device 3' in accordance with a fourth embodiment of the present invention. According to this fourth embodiment, the probing device 3' has two opposite sides, namely, the top side 3a' and the bottom side 3b'. The top side 3a' is for the connection of the tester, allowing the tester to touch down. The bottom side 3b' is for touching the electronic components of an IC wafer under test to transfer test signals from the tester to the IC wafer for electrical test. The probing device 3' comprises a rack 30', a circuit layer 40', a cantilever probe assembly 50', and a plurality of signal lines 60'.

Figure 15:
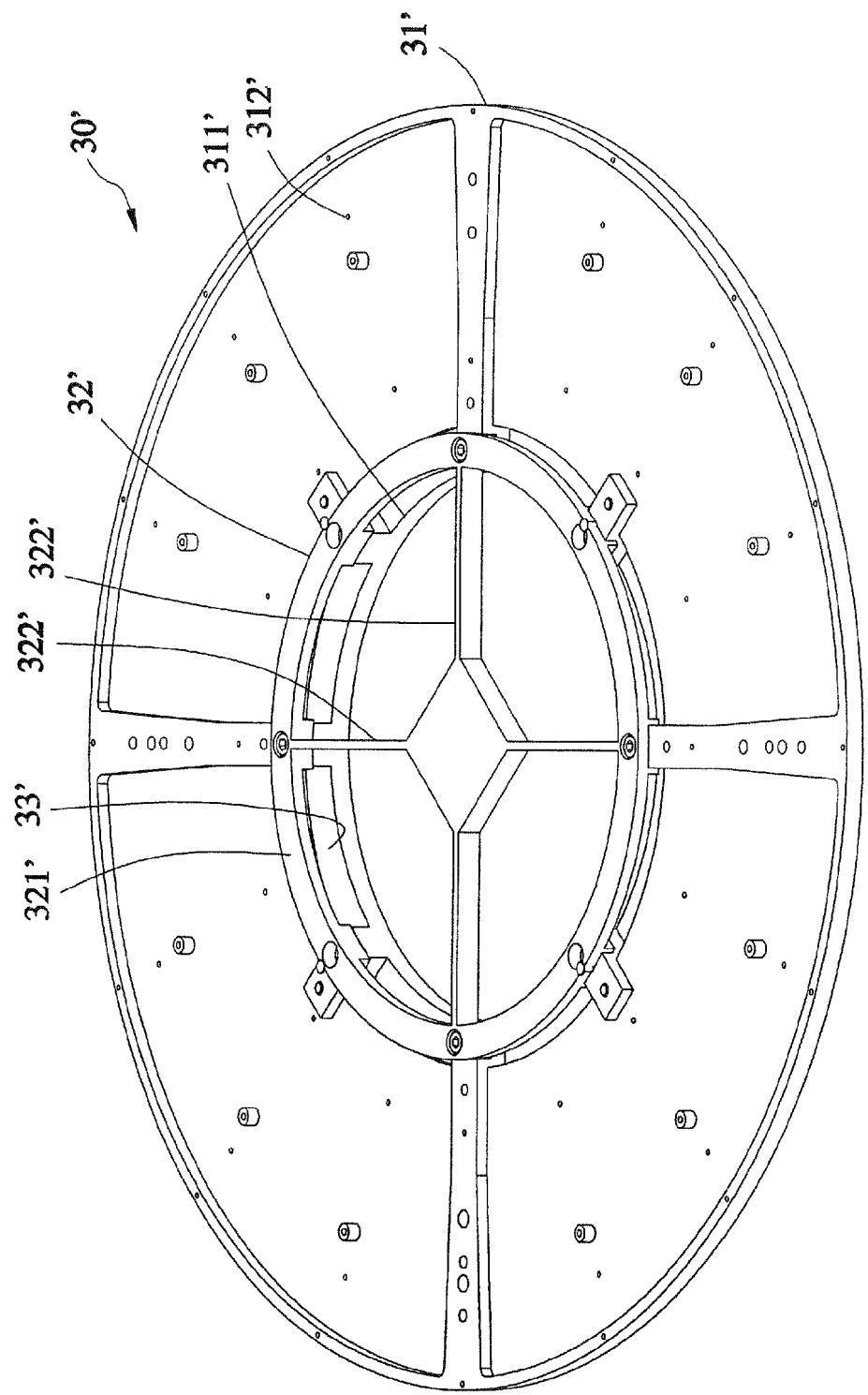
FIG. 15 is an oblique top elevation of rack of the fourth embodiment of the present invention.

Referring to FIG. 15 and FIG. 12 again, the rack 30' is formed of an inner rigid body structure and an outer rigid body structure, namely, the outer first support member 31' and the inner second support member 32'. The first support member 31' shows an annular structure, having an area about equal to the transverse cross section of the circuit layer 40' for supporting the mounting of the circuit layer 40' and bearing stress from the circuit layer 40'. The first support member 31' has an inner frame 311', and a plurality of through holes 312' for the insertion of the signal lines 60'. The second support member 32' is an annular frame member comprising an outer frame 321' and a plurality of radial ribs 322'. The outer frame 321' of the second support member 32' is affixed to the inner frame 311' of the first support member 31', protruding over the bottom side of the first support member 31' at a distance so that multiple gaps 33' are defined between the first support member 31' and the second support member 32' for the passing of the signal lines 60' from the border area of the rack 30' to the center area thereof. The ribs 322' extend in radial direction on the same plane relative to the outer frame 321' to provide a relatively higher support strength for supporting the cantilever probe assembly 50' and evenly bearing the stress from the cantilever probe assembly 50'. Further, the signal lines 60' can be inserted through the space defined between each two adjacent ribs 322' and then connected to the cantilever probe assembly 50'.

Figure 16:
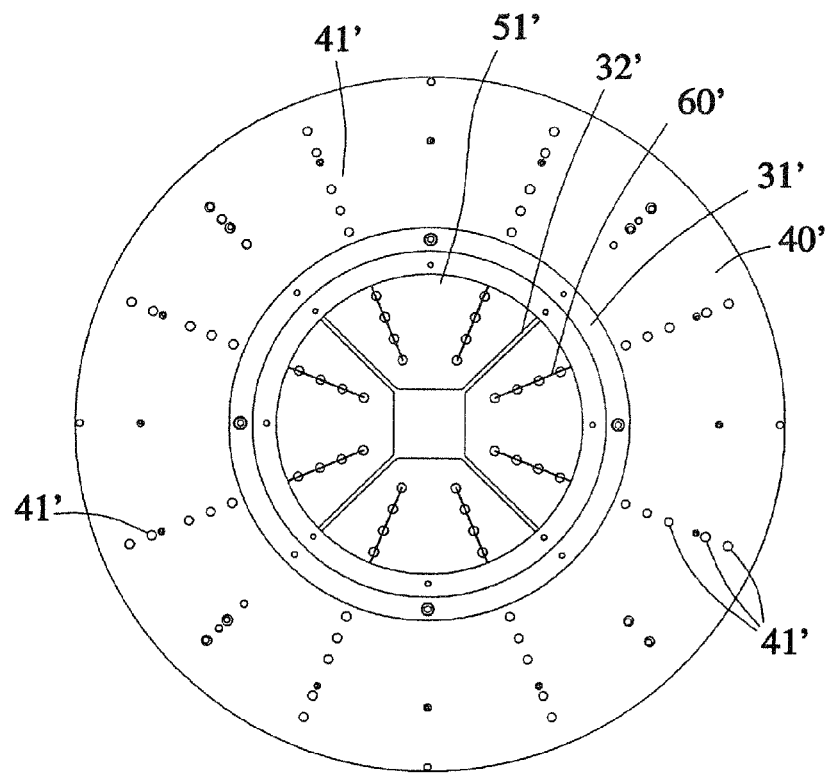
FIG. 16 is a top view of a part of the fourth embodiment of the present invention, showing the circuit layer, signal lines and probe assembly provided at the top side of the rack.

Referring to FIG. 16 and FIGS. 12 and 14 again, the circuit layer 40' is mounted on the top side of the first support member 31' and disposed at the top side 3a' of the probing device 3'. The circuit layer 40' comprises a plurality of test contacts 41' for the contact of the aforesaid tester so as to receive test signals from the tester. The test contacts 41' are vertically extending to the bottom side of the circuit layer 40' for the connection of the signal lines 60' so that test signals can be transferred from the tester to the signal lines 60'.

Figure 17:
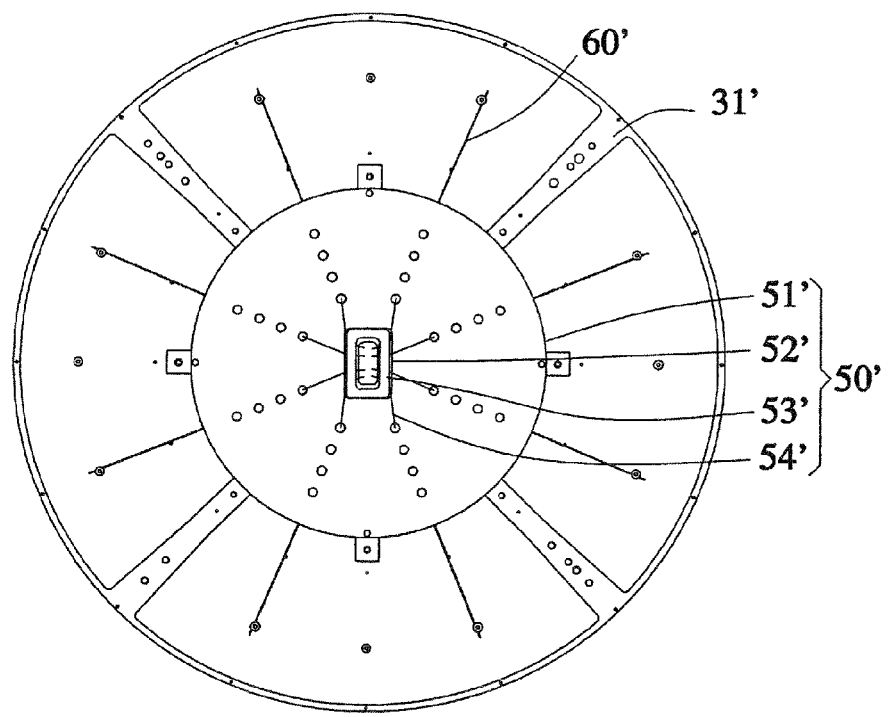
FIG. 17 is a bottom view of FIG. 16.

Referring to FIG. 17 and FIGS. 12 and 14 again, the cantilever probe assembly 50' comprises an adapter board 51', a probe holder 52', a locating ring 53', and a plurality of cantilever probes 54'. The adapter board 51' is a single layer printed circuit board mounted on the bottom side of the second support member 32' and disposed at the bottom side 3b' of the probing device 3'. Further, the adapter board 51' comprises a plurality of solder points 510' disposed at the top and bottom sides thereof, and a plurality of electronic components 511' electrically connected to the solder points 510'. The solder points 510' at the top and bottom sides of the adapter board 51' are for the bonding of the signal lines 60' and the cantilever probes 54' respectively so that the signal lines 60' and the cantilever probes 54' can be respectively electrically connected in vertical direction or, the test signals transmitted through the signal lines 60' can be processed through the electronic components 511' and then transmitted to the cantilever probes 54'. The probe holder 52' is made of electrically insulated material and mounted in the center area of the adapter board 51'. The locating ring 53' is made of an electrically insulated sticky material and mounted in the probe holder 52'. The cantilever probes 54' are fastened with the respective bodies thereof to the probe holder 52' by means of the locating ring 53' in such manner that the tips of the cantilever probes 54' are suspending below the locating ring 53'.

Referring to FIGS. 12~14 again, when the rack 30', the circuit layer 40' and the cantilever probe assembly 50' are assembled, the top and bottom sides of the assembly are respectively fixedly covered with a top cover 301' and a bottom cover 302'. The top cover 301' is covered on the inner frame 311' of the first support member 31'. The bottom cover 302' surrounds the adapter board 51' to seal the signal lines 60' inside the probing device 3', making the probing device 3' beauty and preventing external objects from entering the inside of the probing device 3, and therefore the packaging quality of the probing device 3' is maintained.

Therefore, the probing device 3' of this embodiment utilizes the rigid structure of the first support member 31' to support the circuit layer 40' and the second support member 32' to support the cantilever probe assembly 50'. When the tester touches down the test contacts 41' of the circuit layer 40', the first support member 31' bears the stress; when the probes 54' at the bottom side 3b' touch respective electronic components of the IC wafer under test, the second support member 32' bears the reaction force from the wafer. Therefore, this embodiment simplifies the fabrication of a multi-layer printed circuit board. Further, the rack 30' is suitable for mass production and practical for use in any equivalent structure of circuit layer and probe assembly, shortening probing device fabrication time. Further, because the circuit layer 40' and the adapter board 51' commonly have a single layer structure made of an electrically insulated material, the traveling path of each test signal that goes through the circuit layer 40' and the adapter board 51' is short, thereby effectively eliminating the effect of leakage current between two adjacent transmission signals during transfer of the test signals through the dielectric material. Further, because the vertical signal traveling paths do not go through any interlayer dielectric, the probing device 3' eliminates the problem of energy loss in an interlayer dielectric as commonly seen in the plating through hole structure of a conventional multi-layer printed circuit board. Therefore, the probing device 3' maintains excellent signal impedance matching characteristic during a high frequency test, assuring low signal loss and high signal transmission quality.

It is to be understood that the structures of the circuit layer 40' and the adapter board 52' are not limited to a single layer. If the energy loss is maintained within the acceptable range, the circuit layer 40' and the adapter board 52' can have a two-layer structure, enhancing the structural strength.

Figure 18:
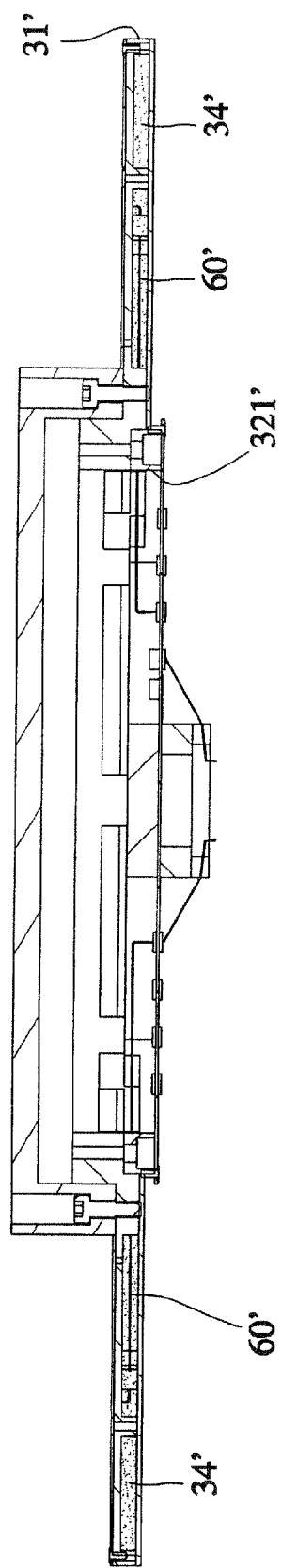
FIG. 18 is a schematic drawing of the fourth embodiment of the present invention after filling of the adhesive.

Referring to FIG. 18, an adhesive (for example, epoxy resin) 34' may be filled in the rack 30' between the first support member 31' and the outer frame 321' of the second support member 32' to enhance the structural strength of the probing device 3' and to encapsulate the signal lines 60', isolating the signal lines 60' from external moisture.

Figure 19:
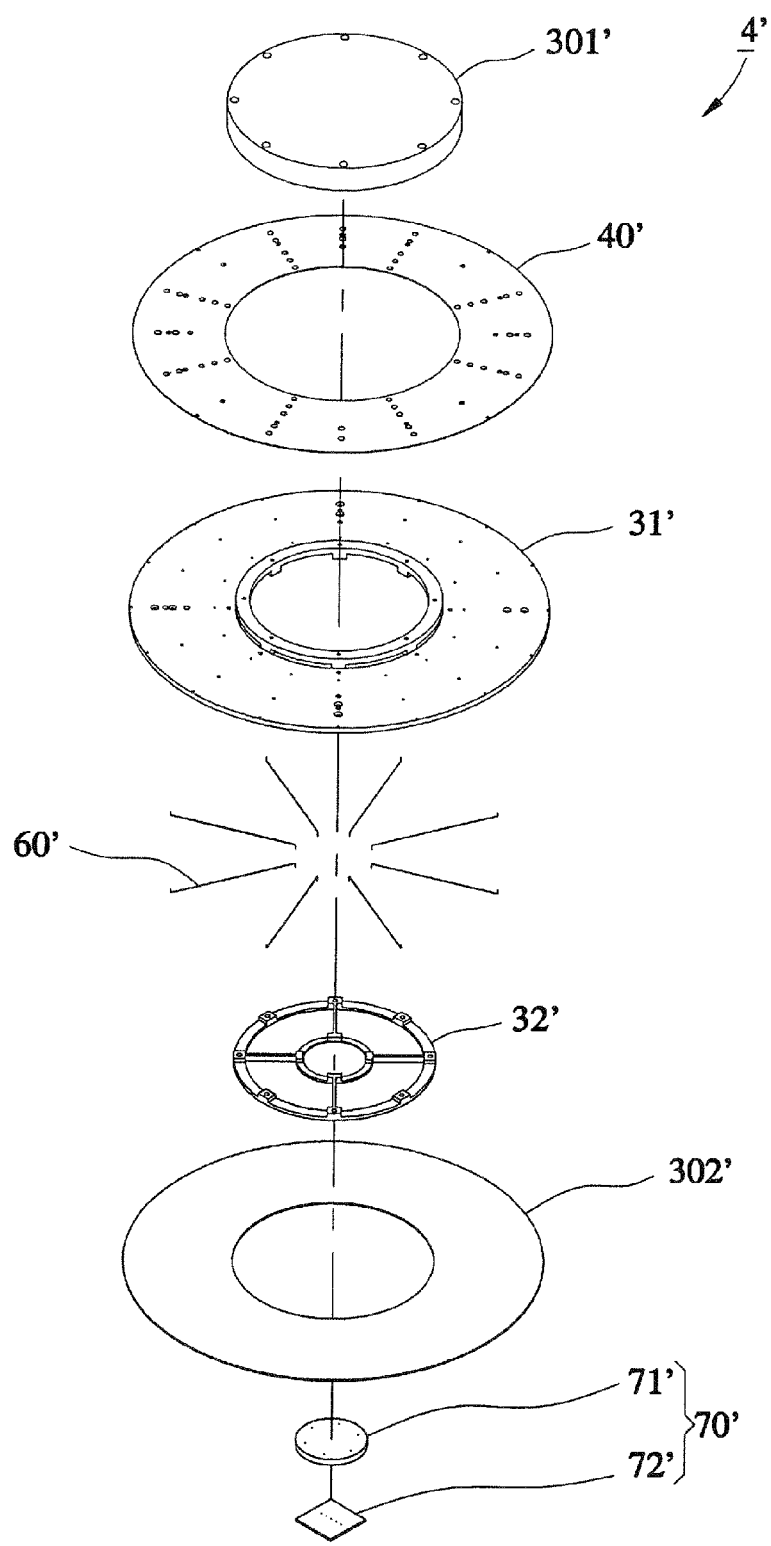
FIG. 19 is a schematic exploded view of a probing device in accordance with a fifth embodiment of the present invention.
Figure 20:
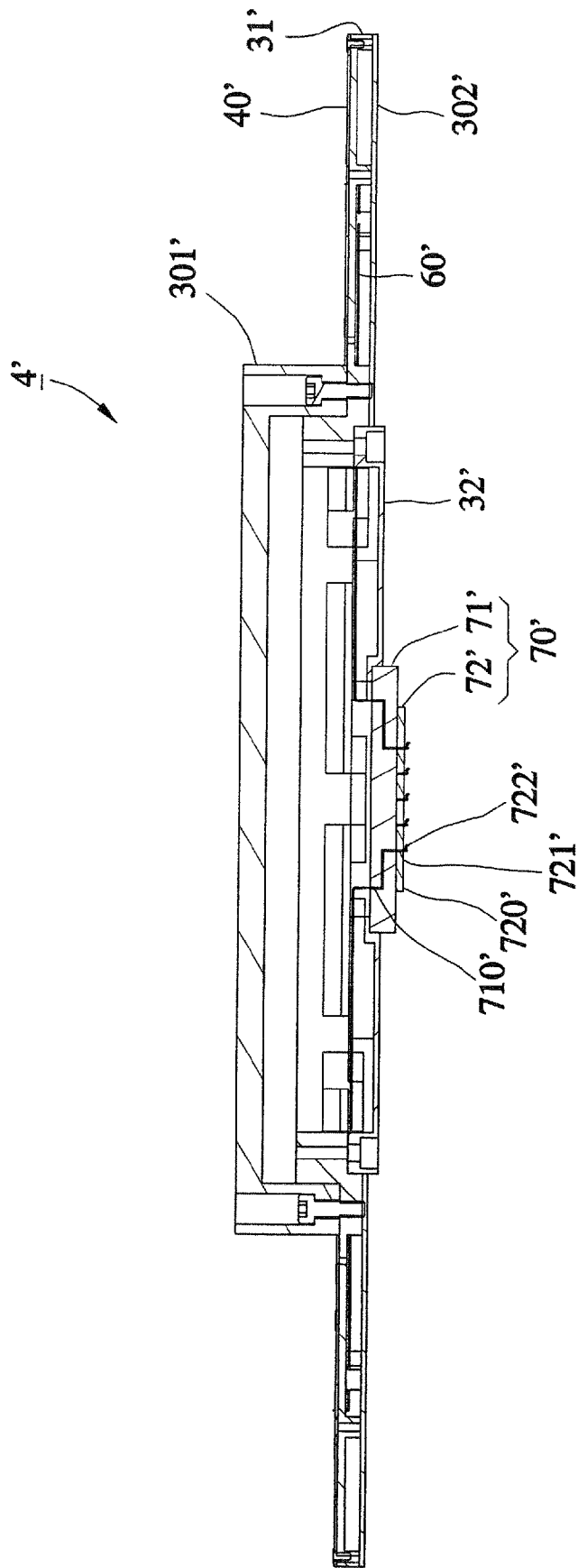
FIG. 20 is a schematic sectional assembly view of the probing device in accordance with the fifth embodiment of the present invention.

FIGS. 19 and 20 show a probing device 4' in accordance with a fifth embodiment of the present invention. According to this embodiment, the probing device 4' is comprised of a rack 30', a circuit layer 40', signal lines 60', and an integrated probe assembly 70'. The integrated probe assembly 70' is provided at the bottom side of the second support member 32' of the rack 30'. Unlike the individual probe design of the aforesaid fourth embodiment, this fifth embodiment employs the probe assembly 70' with an integrated manufacturing process of a micro-electro mechanical system (MEMS).

The integrated probe assembly 70' is a package structure comprised of an adapter board 71' and a MEMS probe device 72'. The adapter board 71' is made of an electrically insulated material which can be a multi-layered organic structure or a multi-layered ceramic structure, having a circuit space transforming function. Further, the adapter board 71' has multiple conductive wires 710' arranged therein. These conductive wires 710' are arranged in such a manner that the distance between each two adjacent conductive wires reduces gradually from the top side of the adapter board 71' toward the bottom side of the adapter board 71'. The conductive wires 710' extend vertically through the adapter board 71', having the top ends thereof respectively electrically connected with the signal lines 60', and the bottom ends thereof respectively electrically connected with the MEMS probe device 72'. The MEMS probe device 72' comprises a probe holder 720' formed of an electrically insulated substrate, and a plurality of probes 722' formed on the probe holder 720' by means of a MEMS process. The probe holder 720' comprises a plurality of via holes 721' respectively electrically connected with the probe 722'. Therefore, the packing of the integrated probe assembly 70' is done by means of electrically connecting the conductive wires 710' of the adapter board 71' to the via holes 721' of the probe holder 720'.

Further, the MEMS probe device can be formed by means of directly forming the MEMS probes 722' on the adapter board 71'. Because the MEMS probes 722' are directly and electrically connected to the respective conductive wires 710', the adapter board 71' works as a probe holder to hold the MEMS probes as well as a circuit board with space transforming function.

Therefore, when the circuit layer 40' received test signals from the tester, the signal lines 60' immediately transfer these test signals to the probe 722' of the MEMS probe device 72' through the conductive wires 710' of the adapter board 71'. In addition to the functions equivalent to the aforesaid fourth embodiment, the probing device 4' of this fifth embodiment is practical for testing electronic components of an ultra-fine pitch wafer by means of the MEMS probe device 72'.

Figure 21:
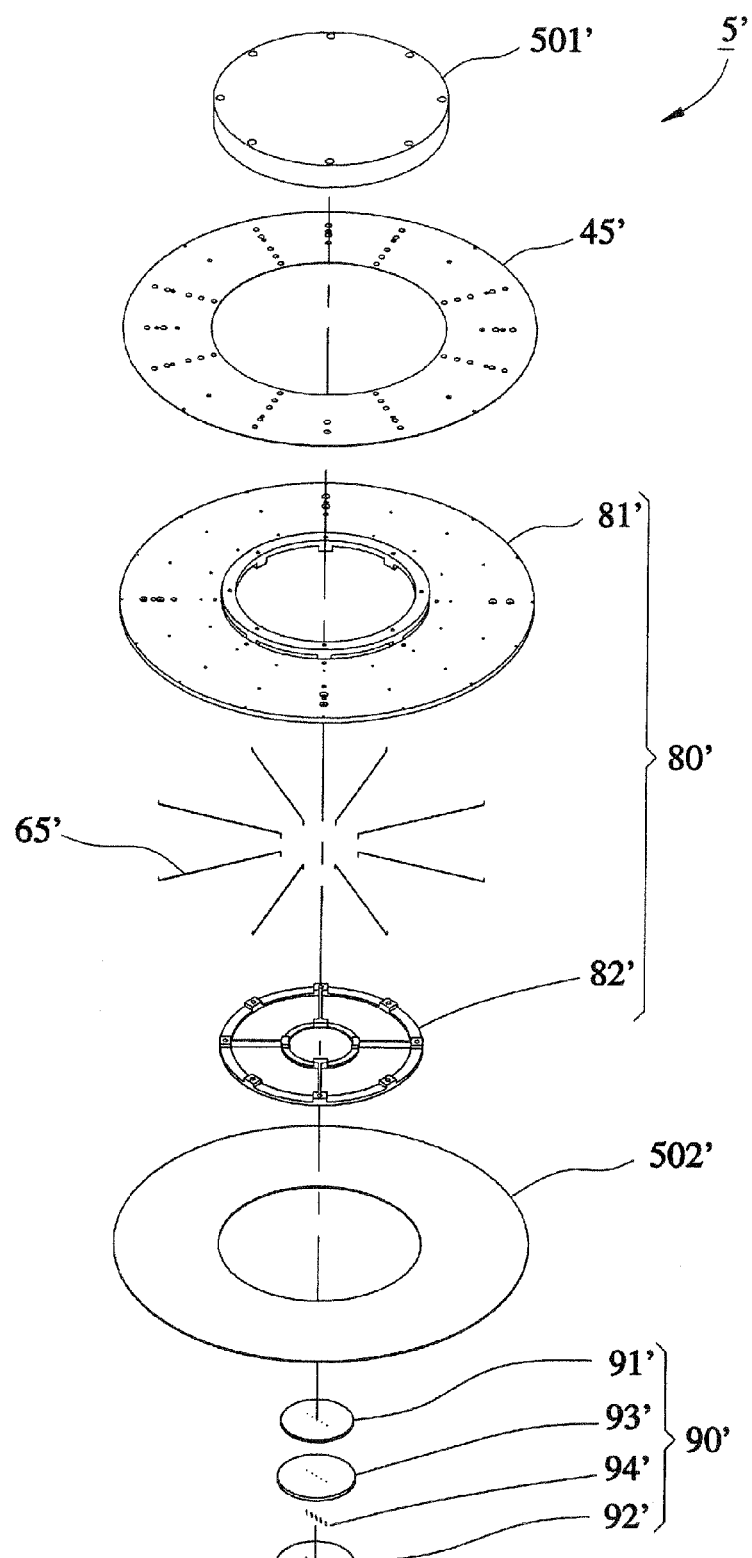
FIG. 21 is a schematic exploded view of a probing device in accordance with a sixth embodiment of the present invention.
Figure 22:
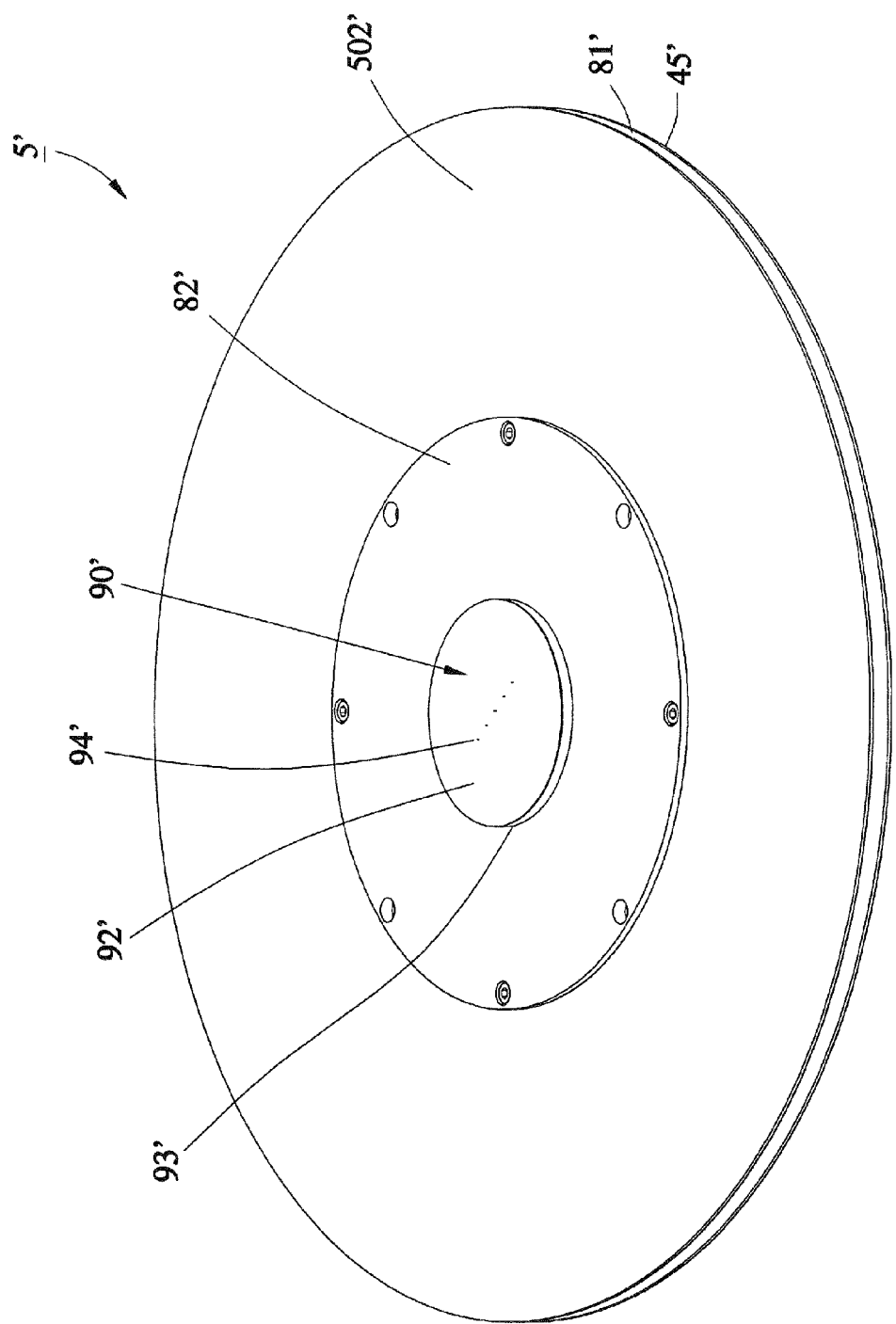
FIG. 22 is an oblique bottom elevation of the sixth embodiment of the present invention.
Figure 23:
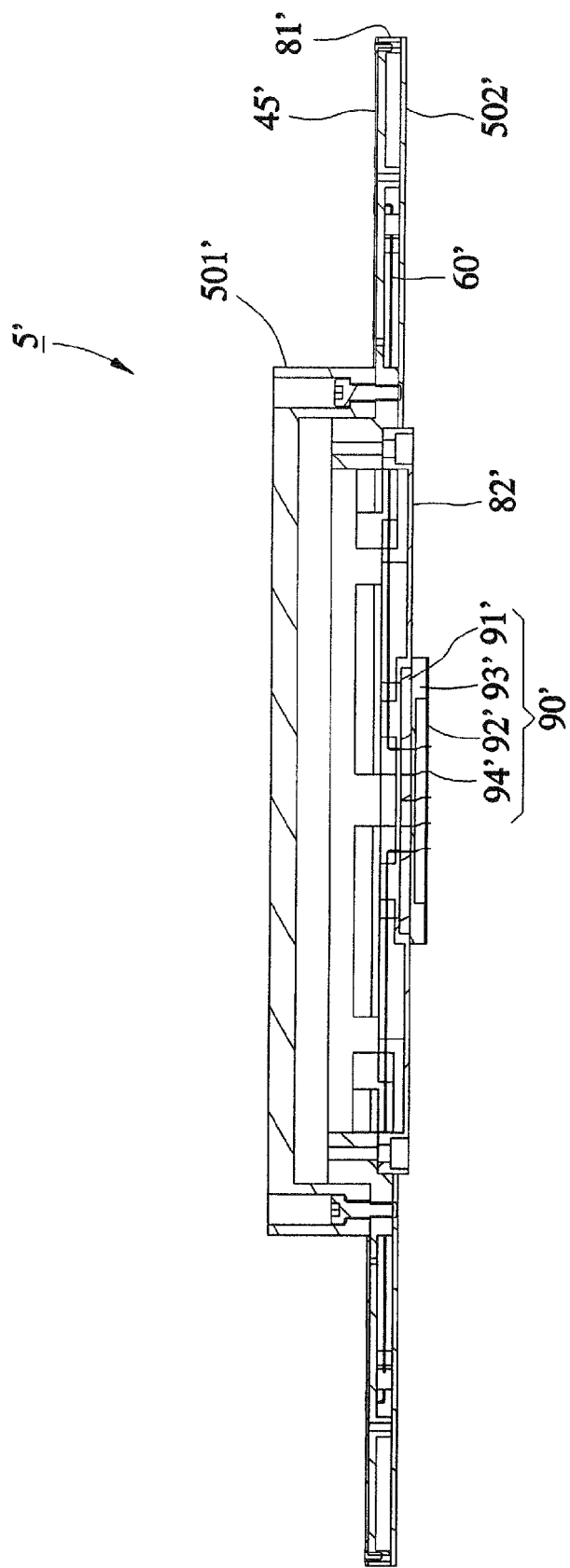
FIG. 23 is a schematic sectional assembly view of the probing device in accordance with the sixth embodiment of the present invention.

The probing device can be made in the form shown in FIGS. 21~23. According to this sixth embodiment, the probing device 5' is an application of a vertical probe structure, comprising a circuit layer 45', a rack 80', a plurality of signal lines 65', a top cover 501', a bottom cover 502', and a vertical probe assembly 90'. The rack 80' comprises a first support member 81' disposed at an outer side for supporting the circuit layer 45', and a second support member 82' disposed at an inner side for supporting the vertical probe assembly 90'. When compared to the aforesaid fifth embodiment, this sixth embodiment has the following features:

The vertical probe assembly 90' comprises a probe holder formed of a top plate 91', a bottom plate 92' and an intermediate positioning plate 93', and a plurality of vertical probes 94' installed in the probe holder. The top plate 91' is fixedly mounted on the bottom side of the second support member 82' of the rack 80' so that the vertical probes 94' are respectively electrically connected to the signal lines 65'. The top plate 91', the bottom plate 92' and the intermediate positioning plate 93' are respectively made of an electrically insulated material. The vertical probes 94' extend vertically through the top plate 91', the bottom plate 92' and the intermediate positioning plate 93', each having one end electrically connected to the one associating signal line 65' and the other end terminating in tip and suspending below the bottom plate 92'.

Therefore, the probing device 5' of this sixth embodiment utilizes the rigid structure of the rack 80' to support the circuit layer 45' at the top side and the vertical probe assembly 90' at the bottom side, effectively bearing the stress received by the circuit layer 45' and the vertical probe pin set 90'. Further, because the vertical probe assembly 90' are directly connected to the signal lines 65', the signal lines 65' directly transfer test signals from the tester to the probes 94', and therefore no any intermediate adapter circuit means between the signal lines 65' and the probes 94' is necessary.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A probing device for transmitting test signals from a tester to an IC wafer for measuring electric characteristics of said IC wafer, the probing device comprising:
   a rack, said rack defining a top surface and a bottom surface opposing said top surface, said rack comprising a first support member and a second support member surrounded by said first support member;
   a circuit layer mounted on said top surface of said rack and supported on said first support member, said circuit layer comprising a plurality of test contacts for electrical connection of said tester;
   a probe assembly, said probe assembly comprising an electrically insulated probe holder supported on said second support member and a plurality of probes fixedly mounted in said probe holder, each said probe having a tip suspending below said probe holder; and
   a plurality of signal lines electrically connected between said test contacts of said circuit layer and said probes of said probe assembly; wherein
   the first support member of said rack comprises at least one ring portion and a plurality of radial ribs, the cross-sectional region of the composition of said at least one ring portion and said radial ribs being corresponding to the transverse cross-sectional region of said circuit layer and kept in contact with one horizontal surface of said circuit layer.

2. The probing device as claimed in claim 1, further comprising an adhesive filled in said rack between said top surface and said bottom surface.

3. The probing device as claimed in claim 1, wherein said rack is integrally made in a single piece form.

4. The probing device as claimed in claim 3, wherein said rack is made of a metal material.

5. The probing device as claimed in claim 4, wherein said metal material is stainless steel.

6. The probing device as claimed in claim 1, wherein said circuit layer is a single-layer printed circuit board, made of electrical insulated material.

7. The probing device as claimed in claim 6, wherein said circuit layer comprises a plurality of electrically conductive via holes respectively electrically connected between said test contacts and said signal lines.

8. The probing device as claimed in claim 1, wherein said probe holder is provided at a bottom side of said second support member of said rack.

9. The probing device as claimed in claim 8, wherein said probe assembly further comprises an adapter board provided at the bottom surface of said rack and set between said first support member and said second support member to hold said probes in electrical connection with said adapter board.

10. The probing device as claimed in claim 9, wherein said adapter board is a single-layer printed circuit board made of electrically insulated material; said adapter board having a plurality of electrically conducted via holes and respectively electrically connected between said signal lines and said probes.

11. The probing device as claimed in claim 8, wherein said probes extending through said probe holder, each said probe having one end forming the respective tip and an opposite end electrically connected to one said signal line.

12. The probing device as claimed in claim 1, wherein said circuit layer comprises a plurality of through holes respectively disposed below said test contacts for the passing of said signal lines to electrically connect said test contacts.

13. The probing device as claimed in claim 1, wherein said circuit layer comprises a plurality of signal solder points disposed on one same plane relative to said test contacts; said signal lines are respectively electrically connected to said signal solder points.

14. The probing device as claimed in claim 13, wherein said second support member of said rack surrounds said probe holder; said probes extend through said probe holder, each said probe having one end forming the respective tip and an opposite end electrically connected to one said signal line.

15. The probing device as claimed in claim 14, wherein said probe assembly further comprises a locating block surrounded by said second support member of said rack; said probe holder is provided at a bottom side of said locating block; said signal lines extend through said locating block.

16. A probing device defining a top side and a bottom side for electrical connection of a tester and an IC wafer respectively for transmitting test signals from said tester to said IC wafer to measure electric characteristics of said IC wafer, the probing device comprising:
   a rack, said rack comprising a first support member and a second support member surrounded by said first support member;
   a circuit layer mounted on the top side of said rack and supported on said first support member, said circuit layer comprising a plurality of test contacts for electrical connection of said tester;
   a probe assembly mounted on the bottom side of said rack and supported on said second support member, said probe assembly comprising an electrically insulated probe holder and a plurality of probes, each said probe having a tip suspending below said probe holder; and a plurality of signal lines electrically connected between said test contacts of said circuit layer and said probes of said probe assembly; wherein said rack comprises a plurality of gaps defined between said first support member and said second support member; said signal lines are extended through said gaps to connect to said probes of said probe assembly; wherein said first support member comprises an inner frame; said second support member comprises an outer frame affixed to said inner frame of said first support member; said gaps are defined between said inner frame of said first support member and said outer frame of said second support member.

17. The probing device as claimed in claim 16, wherein said first support member is an annular shaped structure having a plurality of through holes; said signal lines are extended through said through holes.

18. The probing device as claimed in claim 16, further comprising an adhesive filled in said rack between said first support member and said second support member.

19. The probing device as claimed in claim 16, wherein said signal lines are respectively electrically connected to said test contacts and disposed at a bottom side of said circuit layer; said circuit layer is a single-layer printed circuit board made of an electrically insulated material.

20. The probing device as claimed in claim 16, wherein said probes are formed on said probe holder by means of an integrated manufacturing process of a micro-electro mechanical system; said probe holder having a plurality of conductive wires arranged therein, which are respectively electrically connected between said signal lines and said probes.

21. The probing device as claimed in claim 20, wherein said conductive wires extend from a top side of said probe holder to a bottom side of said probe holder, and the distance between each two adjacent conductive wires reduces gradually in a direction from the top side of said probe holder toward the bottom side of said probe holder; said signal lines are respectively electrically connected to said conductive wires at the top side of said probe holder; said probes are respectively electrically connected to said conductive wires at the bottom side of said probe holder.

22. The probing device as claimed in claim 21, wherein said probe holder is made in one of the forms of multi-layered organic structure and multi-layered ceramic structure.

23. The probing device as claimed in claim 16, wherein said probes extend vertically through said probe holder, each having a top end respectively electrically connected to said signal lines and a bottom end suspending below said probe holder.

24. The probing device as claimed in claim 16, wherein said probe assembly further comprises an adapter board provided at a bottom side of said second support member of said rack; said probe holder is affixed to said adapter board; said probes are respectively electrically connected with said signal lines at said adapter board.

25. The probing device as claimed in claim 24, wherein said adapter board is a single-layer printed circuit board made of an electrically insulated material; said signal lines are soldered to a top side of said adapter board; said probes are electrically connected to a bottom side of said adapter board; said signal lines are respectively electrically connected to said probes via said adapter board in a vertical connection.

26. The probing device as claimed in claim 24, wherein said adapter board comprises at least one electronic component electrically connected with said signal lines and said probes.

27. The probing device as claimed in claim 24, wherein said adapter board is made of an electrically insulated material, having a plurality of conductive wires arranged therein and extending from a top side of said adapter board toward a bottom side of said adapter board, the space between each two adjacent conductive wires being reduced gradually in a direction from the top side of said adapter board toward the bottom side of said adapter board; said signal lines are respectively electrically connected to said conductive wires at the top side of said adapter board; said probes are respectively electrically connected to said conductive wires at the bottom side of said adapter board.

28. The probing device as claimed in claim 27, wherein said adapter board is made in one of the forms of multi-layered organic structure and multi-layered ceramic structure.

29. The probing device as claimed in claim 27, wherein said probes extend vertically through said probe holder, each having a top end respectively electrically connected to said signal lines and a bottom end suspending below said probe holder.

30. The probing device as claimed in claim 27, wherein said probes are formed on said probe holder by means of an integrated manufacturing process of a micro-electro mechanical system; said probe holder comprises a plurality of electrically conductive via holes respectively electrically connected between said conductive wires of the adapter board and said probes.

31. The probing device as claimed in claim 30, wherein said probes extend vertically through said probe holder, each having a top end respectively electrically connected to said signal lines and a bottom end suspending below said probe holder.

* * * * *